US008156400B1

(12) United States Patent
Yeo et al.

(10) Patent No.: US 8,156,400 B1
(45) Date of Patent: Apr. 10, 2012

(54) EMBEDDED PARITY CODING FOR DATA STORAGE

(75) Inventors: Engling Yeo, Milpitas, CA (US); Eugene Pan, Milpitas, CA (US); Henri Sutioso, San Jose, CA (US); Jun Xu, Milpitas, CA (US); Shaohua Yang, San Jose, CA (US); Panu Chaichanavong, Mountain View, CA (US); Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 1307 days.

(21) Appl. No.: 11/827,339

(22) Filed: Jul. 11, 2007

Related U.S. Application Data

(63) Continuation of application No. 11/809,670, filed on Jun. 1, 2007.

(60) Provisional application No. 60/810,495, filed on Jun. 2, 2006.

(51) Int. Cl.
*H03M 13/00* (2006.01)
(52) U.S. Cl. ...................................... 714/758; 714/774
(58) Field of Classification Search .................. 714/758, 714/774
See application file for complete search history.

(56) References Cited

U.S. PATENT DOCUMENTS

| 6,633,856 | B2 | 10/2003 | Richardson |
| 6,789,227 | B2 | 9/2004 | DeSouza et al. |
| 6,895,547 | B2 | 5/2005 | Eleftheriou |
| 7,127,659 | B2 * | 10/2006 | Richardson et al. ........ 714/758 |
| 7,184,486 | B1 | 2/2007 | Wu et al. |
| 7,590,920 | B2 | 9/2009 | Yang et al. |
| 7,600,172 | B2 * | 10/2009 | Berens et al. ............... 714/751 |
| 2003/0014718 | A1 | 1/2003 | DeSouza et al. |
| 2004/0034828 | A1 | 2/2004 | Hocevar |
| 2004/0240590 | A1 * | 12/2004 | Cameron et al. ............ 375/340 |
| 2005/0160351 | A1 * | 7/2005 | Ko et al. ..................... 714/801 |
| 2005/0283709 | A1 * | 12/2005 | Kyung et al. ............... 714/758 |
| 2006/0026486 | A1 * | 2/2006 | Richardson et al. ........ 714/758 |
| 2006/0107193 | A1 * | 5/2006 | Park et al. ................... 714/801 |
| 2006/0156163 | A1 * | 7/2006 | Berens et al. ............... 714/748 |
| 2006/0156169 | A1 * | 7/2006 | Shen et al. .................. 714/752 |
| 2007/0043997 | A1 | 2/2007 | Yang et al. |
| 2007/0044006 | A1 | 2/2007 | Yang et al. |

OTHER PUBLICATIONS

ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.

(Continued)

*Primary Examiner* — M. Mujtaba K Chaudry

(57) ABSTRACT

A decoder memory system comprises a first memory comprising at least a portion of a parity check matrix H. A second memory receives the portion from the first memory and that is associated with a previous decoding iteration. A third memory communicates with the first memory, receives the parity check matrix H and is associated with a current decoding iteration. A fourth memory comprises likelihood ratios. A control module generates a LDPC decoded signal based on the parity check matrix H, the previous decoded iteration and the likelihood ratios.

45 Claims, 25 Drawing Sheets

OTHER PUBLICATIONS

IEEE Std 802.11a-1999 (Supplement to IEEE Std 802.11-1999) [Adopted by ISO/IEC and redesignated as ISO/IEC 8802-11: 1999/Amd 1:2000(E)]; Supplement to IEEE Standard for Information technology— Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.11b-199/Cor 1-2001 (Corrigendum to IEEE Std 802.11-1999); IEEE Standard for Information technology—Telecommunications and information exchange between systems—Local and metropolitan area networks—Specific requirement—Part 11; Wireless LAN Medium Access Control (MAC) and Physical Layer (PHY) specifications Amendment 2: Higher-Speed Physical Layer (PHY) extension in the 2.4 GHz Band—Corrigendum 1; LAN/MAN Standards Committee of the IEEE Computer Society; Nov. 7, 2001; 23 pages.

IEEE Std 802.11g/D2.8, May 2002 (Supplement to ANSI/IEEE Std 802.11, 1999 Edition) DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band; LAN/MAN Standards Committee of the IEEE Computer Society; 53 pages.

IEEE P802.11g/D8.2, Apr. 2003 (Supplement to ANSI/IEEE Std 802.11-1999(Reaff 2003)); DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

IEEE Std 802.11h-2003 (Amendment to IEEE Std 802.11, 1999 Edition (Reaff 2003)); as amended by IEEE Stds 802.11a-1999, 802.11b-1999, 802.11b-1999/Cor 1-2001, 802.11d-2001, and 802.11g-2003; IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 5: Spectrum and Transmit Power Management Extensions in the 5 GHz band in Europe; IEEE Computer Society LAN/MAN Standards Committee; Oct. 14, 2003; 74 pages.

802.11n; IEEE P802.11-04/0889r6; Wireless LANs, TGn Sync Proposal Technical Specification; May 2005; 131 pages.

IEEE Std 802.16-2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

IEEE 802.20-PD-06, IEEE P 802.20 V14, Jul. 16, 2004, Draft 802.20 Permanent Document, System Requirements for IEEE 802.20 Mobile Broadband Wireless Access Systems—Version 14, 23 pages.

Li, Zongwang et al; "Efficient Encoding of Quasi-Cyclic Low-Density Parity-Check Codes"; IEEE Transactions on Communications, vol. 54, No. 1, Jan. 2006; pp. 71-81.

U.S. Appl. No. 11/449,066; "Tensor Product Codes Containing an Iterative Code"; Jun. 7, 2006; 71 pages.

U.S. Appl. No. 11/518,020; "Error Pattern Generation for Trellis-Based Detection and/or Decoding"; Sep. 8, 2006; 95 pages.

Specification of the Bluetooth System—Specification vol. 0; Master Table of Contents & Compliance Requirements; Covered Core Package version: 2.0 +EDR; Current Master TOC issued: Nov. 4, 2004; Part A, pp. 1-74; vol. 1, pp. 1-92; vol. 2 & 3, pp. 1-814; vol. 4, pp. 1-250.

* cited by examiner

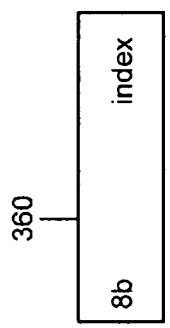

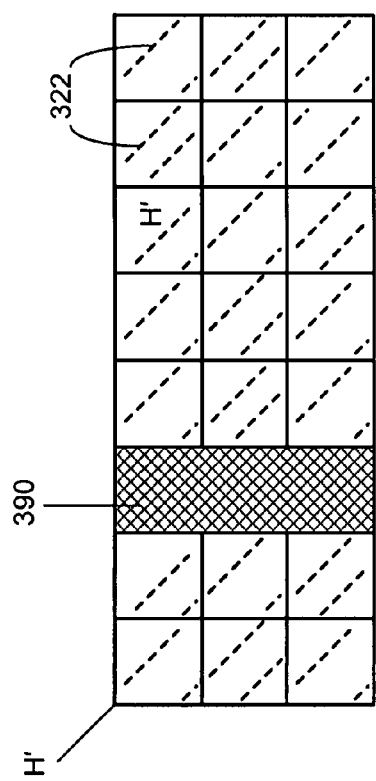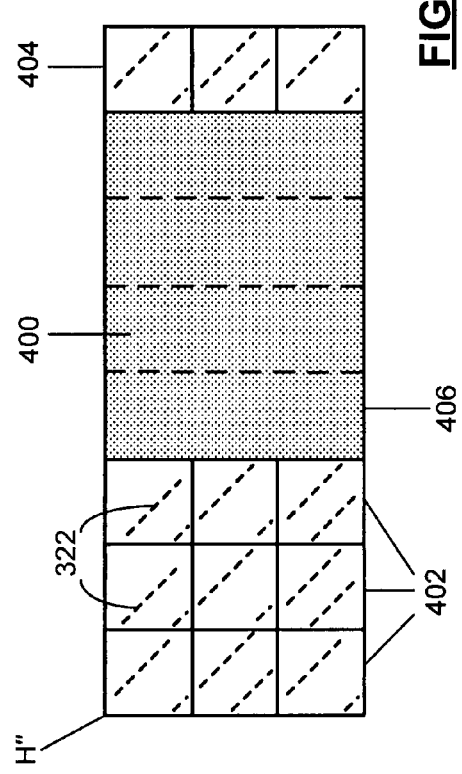

$$H_{orig} = \begin{bmatrix} 1 & 2 & 3 \\ 2 & 3 & 4 \\ 3 & 4 & 7 \\ 4 & 7 & 1 \\ 7 & 1 & 8 \\ 1 & 8 & 5 \\ 8 & 5 & 3 \\ 5 & 3 & 2 \\ 3 & 2 & 3 \end{bmatrix} \qquad H_{new} = \begin{bmatrix} 1 & 2 & 3 \\ 2 & 3 & 4 \\ 6 & 7 & 10 \\ 4 & 7 & 1 \\ 7 & 1 & 8 \\ 1 & 8 & 5 \\ 8 & 5 & 3 \\ 5 & 3 & 2 \\ 3 & 2 & 3 \end{bmatrix}$$

FIG. 23

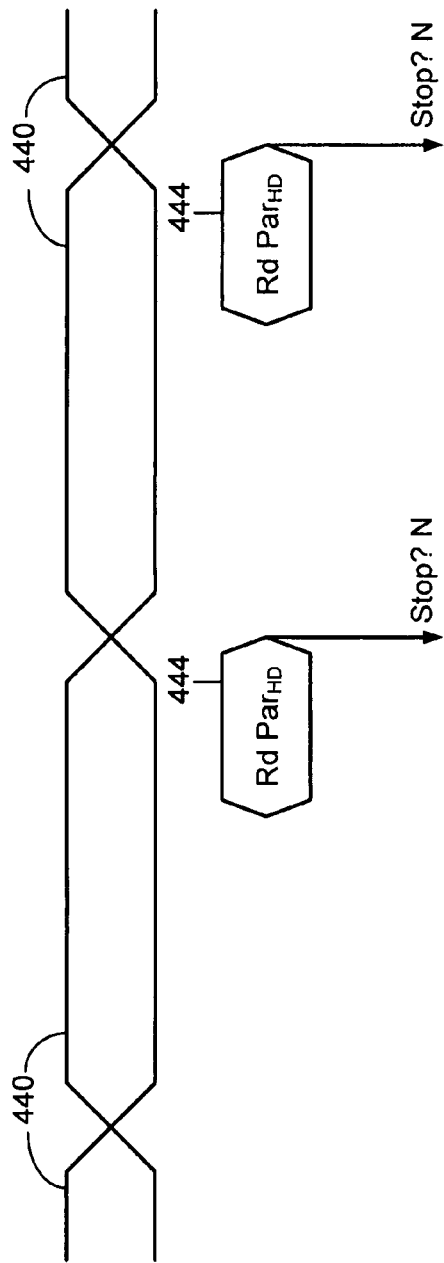
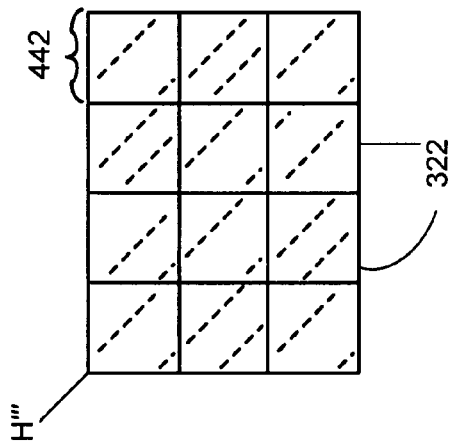
FIG. 24
FIG. 25

EMBEDDED PARITY CODING FOR DATA STORAGE

CROSS-REFERENCE TO RELATED APPLICATIONS

This application is a continuation of U.S. patent application Ser. No. 11/809,670, filed on Jun. 1, 2007, which application claims the benefit of U.S. Provisional Application No. 60/810,495, filed Jun. 2, 2006. This application is related to U.S. patent application Ser. No. 11/518,020, filed on Sep. 8, 2006. The disclosures of the above applications are incorporated herein by reference in their entirety.

FIELD

The present disclosure relates to channel encoding and decoding architectures, and more particularly to low-density parity check code based systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In communication systems, the Shannon limit expresses the maximum data speed that can be obtained in a data channel. Shannon's Law states that the highest obtainable error-free data speed is a function of the bandwidth and the signal-to-noise ratio. Error correction coding (ECC) techniques attempt to increase channel performance towards the Shannon limit.

Low-density parity check codes (LDPCs) are ECC codes that allow a channel to have data speeds near the Shannon limit. LDPCs provide coding gain that improves performance. The coding gain can be used for a variety of purposes, such as allowing lower transmit power, higher data throughput, longer transmit distances, and/or increased reliability. When transmit power is limited, the extra coding gain of LDPCs can make the difference between reliable and unreliable communication.

One coding technique that uses LDPCs, referred to as tensor-product code (TPC), incorporates two levels of ECC. A first or inner level protects channel/information bits and employs a single parity check (SPC) code, which appends parity bit to each K data bits. The SPC blocks share redundancy across a sector or memory location. A second or outer level code is the LDPC code, which acts on the parity bits of the inner level. The LDPC code protects the parity bits of the inner level.

An associated decoder for this technique has two stages. A first stage decodes the outer level code and a second stage post processes the result to enforce the SPC parity constraint on the channel bits. This is described in further detail below with respect to FIGS. 1-2.

Referring to FIG. 1, a sample 10-bit SPC code is shown. A non-return-to-zero (NRZ) sector may be subdivided into 10-bit symbols $s_k(0:9)$. Symbol length, in general, coincides with Reed-Solomon (RS) error correction coding (ECC) symbol length. To generate an LDPC codeword the bits of each 10-bit symbol are exclusive-OR'd (XOR) together to generate parity bits p, as shown and expressed by equation 1.

$$p_k = \bigoplus_{i=0}^{9} s_k(i) \tag{1}$$

A collection of user bits form a tensor product codeword if and only if SPC parity bits form an LDPC codeword, i.e. $H_p \vec{0} = \vec{0}$.

Referring now to FIG. 2, a functional block diagram illustrating a tensor product coded channel system 10 is shown. The system 10 includes a tensor-product code (TPC) encoder 12, a modulator 14, a channel 16, a detector 18, and a TPC decoder 20. A stream of datawords u is encoded by the TPC encoder 12 to provide a stream of codewords c, which may be in the form of binary data. A dataword may refer to a group of binary data, or user bits, suitable for input to an encoder, such as the TPC encoder 12. A codeword may refer to a group of bits generated by an encoder based on an input dataword.

The modulator 14 manipulates the frequency, amplitude, and/or phase of the stream of codewords c to generate a communication/storage signal, such as a transmitted signal w. The transmitted signal w is communicated and/or stored on the channel 16. The channel 16 provides a received signal w', which may be a corrupted version of the transmitted signal w. The channel 16 may, for example, be a storage medium, such as a magnetic storage medium, an optical storage medium, or an electrical storage medium or other communication channel. The data corruption may be due to noise or interference.

The detector 18 demodulates the received signal w' and provides an initial estimate signal $\hat{r}$ of the stream of codewords c. The TPC decoder 20 decodes the initial estimate signal $\hat{r}$ to recover the stream of datawords u by detecting and/or correcting any errors in the initial estimate signal $\hat{r}$. Resultant output of the TPC decoder 20 is estimate signal r.

The TPC encoder 12 includes inner and outer code modules 22, 24, which have corresponding inner and outer codes. The TPC encoder 12 generates the stream of codewords c, which includes the stream of datawords u, as well as redundant bits. The redundant bits provide additional information that can be used by the TPC decoder 20 to detect and/or correct errors in a detected codeword. The inner code module 22 uses the inner code to generate a first set of redundant bits. At least a portion of the first set of redundant bits is further encoded based on the outer code to generate a second set of redundant bits. The first and second set of redundant bits may be concatenated onto the stream of datawords u. The second set of redundant bits may be generated based on the first set of redundant bits.

The TPC decoder 20 includes corresponding inner and outer code modules 26, 28. The inner and outer code modules 26, 28 reverse the encoding performed by the inner and outer code modules 22, 24. Result of the decoding process provides the estimate signal r, which is the same as the stream of datawords u when no errors exist.

With the flexibility of LDPCs, codes can be constructed to match a particular block size or code rate. After the block size and code rate are established, an M-by-N parity check matrix H is constructed and contains a sparse number of ones. The number of rows M is greater than or equal to the number of parity bits N-K, where K is the number of information (user) bits. A binary string c, of length N is said to be a codeword in C if and only if $Hc = \vec{0}$. An example parity check matrix H where N=7 and K=5 is provided as equation 2.

$$H = \begin{bmatrix} 1 & 1 & 1 & 1 & 1 & 1 & 1 \\ 1 & 0 & 1 & 0 & 1 & 0 & 1 \\ 0 & 1 & 0 & 1 & 0 & 1 & 0 \end{bmatrix} \quad (2)$$

The LDPC code with the parity check matrix H has, for example, a binary string $c=(1,0,1,0,1,0,1)^T$, which is a codeword in C.

Encoding is done by using equations derived from the H matrix to generate the parity check bits. From the H matrix, the G matrix is evaluated and then used to perform encoding.

Decoding is accomplished using "soft-inputs" with these equations to generate new estimates of the sent values. This process is repeated in an iterative manner resulting in a powerful decoder. The iterative LDPC decoder receives blocks of data, including corrupted bits due to noise, with varying resolution. To decode a block, an iterative process is performed that consists of solving M parity check equations of the H matrix. The confidence levels that the bits in the equations are ones or zeroes is updated using belief propagation or simplified approximations thereof. This is repeated for many iterations. The decoder stops once a valid codeword is found, which satisfies all parity check equations, or when an allotted time has elapsed. Large block sizes and extra iterations improve the performance of the codes, but add to latency, data rate, and memory size issues.

SUMMARY

In one embodiment, an encoder system is provided that includes a receive module that receives a data stream. A parity generation module generates parity bits based on the data stream and a tensor-product code. A parity insertion module combines the parity bits and the data stream to generate encoded bits. In other features, the parity insertion module concatenates the parity bits to the data stream.

In other features, the encoder system includes a parity concatenation module that receives the data stream with first and second user data series and that concatenates error correction parity bits to the second user data series based on user bits in the first and second user data series. The first user data series comprises low-density parity check (LDPC) place holder bits. An interleave module interleaves the error correction parity bits with one or more of the first and second user data series to generate a tensor-product code (TPC) encoder input signal. A TPC encoder receives the TPC encoder input signal and replaces the LDPC place holder bits with LDPC parity bits to generate an encoded signal.

In other features, the encoder system includes a padding module that inserts zeroes within the first user data series. The TPC encoder replaces the zeroes with the LDPC parity bits.

In still other features, the error correction parity bits include Reed-Solomon parity bits. In other features, the TPC encoder generates the LDPC parity bits based on the first and second user data series and a generator matrix. In other features, the TPC encoder performs a bitwise logical AND with the first and second user data series and entries in the generator matrix.

In other features, the TPC encoder generates an encoded data stream based on a generator matrix $$G = \begin{bmatrix} I & G_p \\ 0 & \hat{G}' \end{bmatrix},$$

wherein matrix $G_p$ is a non-low density matrix and matrix $\hat{G}'$ is a non-cyclical matrix. In other features, the matrix $G_p$ comprises circulant matrices.

In other features, the encoder system includes a storing module that stores a selected row of each circulant of the matrix $G_p$. An encoding module generates LDPC parity bits based on the selected row.

In yet other features, the encoding system includes an encoding module that derives remaining rows of the matrix $G_p$ based on the selected row. In other features, the encoder system includes an encoding module that sets end bits of an interleave output of the interleave module to 0.

In other features, the encoder system includes an LDPC parity bit generator that generates a parity vector based on an interleave output of the interleave module and the matrix $G_p$. In other features, the LDPC parity bit generator generates a binary vector based on the interleave output and the matrix $G_p$ and that generates the parity vector based on the binary vector.

In other features, the matrix $\hat{G}'$ is nullified by setting user bits to 0.

In other features, the TPC encoder cycles contents of a memory based on a truncation value prior to encoding an interleave output of the interleave module. In other features, an interleave output of the interleave module includes decoder output bits.

In further features, the matrix $G_p$ includes circulant matrices. In other features, the encoder system further includes a storing module that stores a selected row of each circulant of matrix $G_p$, wherein the TPC encoder generates LDPC parity bits based on the selected row. In other features, the encoding module derives remaining rows of matrix $G_p$ based on the selected row.

In other features, the encoder system includes an encoding module that sets end user bits of the received data stream to 0.

In other features, a LDPC parity bit generator generates a parity vector based on the received data stream and the matrix $G_p$. In other features, the LDPC parity bit generator generates a binary vector based on the received data stream and the matrix $G_p$ and that generates the parity vector based on the binary vector.

In other features, the matrix $\hat{G}'$ is nullified by setting user bits to 0.

In still other features, the TPC encoder cycles contents of a memory based on a truncation value prior to encoding the received data stream. In other features, the TPC encoder receives and encodes decoded LDPC parity bits to generate expected LDPC parity bits.

In other features, the second user data series is concatenated to the first user data series.

In other features, a method of operating an encoder system is provided and includes receiving a data stream. Parity bits are generated based on the data stream and a tensor-product code. The parity bits and the data stream are combined to generate encoded bits. In other features, the parity bits are concatenated to the data stream.

In other features, the method includes receiving the data stream with first and second user data series. Error correction parity bits are concatenated to the second user data series based on user bits in the first and second user data series. The first user data series includes low-density parity check (LDPC) place holder bits. The error correction parity bits are interleaved with one or more of the first user data series and the second user data series to generate a tensor-product code (TPC) encoder input signal. The TPC encoder input signal is received. The LDPC place holder bits are replaced with LDPC parity bits to generate an encoded signal.

In yet other features, the method includes inserting zeroes within the first user data series. The zeroes are replaced with the LDPC parity bits.

In other features, the error correction parity bits include Reed-Solomon parity bits.

In other features, the method includes generating the LDPC parity bits based on the first and second user data series and a generator matrix.

In further features, the method includes performing a bit-wise logical AND with the first and second user data series and entries in the generator matrix.

In other features, the method includes generating an encoded data stream based on a generator matrix $$G = \begin{bmatrix} I & G_p \\ 0 & \hat{G}' \end{bmatrix}.$$

The matrix $G_p$ is a non-low density matrix and the matrix $\hat{G}'$ is a non-cyclical matrix. In other features, the matrix $G_p$ includes circulant matrices. In other features, the method includes storing a selected row of each circulant of the matrix $G_p$. LDPC parity bits are generated based on the selected row. In other features, the method includes deriving remaining rows of the matrix $G_p$ based on the selected row.

In other features, the method of further includes setting end bits of an interleave output of the interleave module to 0.

In other features, the method includes generating a parity vector based on an interleave output of the interleave module and the matrix $G_p$. In other features, the method includes generating a binary vector based on the interleave output and the matrix $G_p$ and generating the parity vector based on the binary vector.

In still other features, the matrix $\hat{G}'$ is nullified by setting user bits to 0.

In other features, the method includes cycling contents of a memory based on a truncation value prior to encoding an interleave output.

In other features, an interleave output includes decoder output bits.

In other features, the matrix $G_p$ includes circulant matrices. In other features, the method further includes storing a selected row of each circulant of the matrix $G_p$ and generating LDPC parity bits based on the selected row. In other features, the method includes deriving remaining rows of the matrix $G_p$ based on the selected row.

In yet other features, the method includes setting end user bits of the received data stream to 0.

In other features, the method includes generating a parity vector based on the received data stream and the matrix $G_p$. In other features, the method includes generating a binary vector based on the received data stream and the matrix $G_p$ and generating the parity vector based on the binary vector.

In other features, the matrix $\hat{G}'$ is nullified by setting user bits to 0.

In other features, the method includes cycling contents of a memory based on a truncation value prior to encoding the received data stream.

In further features, the method includes receiving and encoding decoded LDPC parity bits to generate expected LDPC parity bits.

In other features, the second user data series is concatenated to the first user data series.

In other features, an encoder system is provided and includes receive means for receiving a data stream. Parity generation means for generating parity bits based on the data stream and a tensor-product code is included. Parity insertion means for combining the parity bits and the data stream to generate encoded bits is also included.

In other features, the parity insertion means concatenates the parity bits to the data stream.

In other features, the encoder system includes parity concatenation means for receiving the data stream, which includes first and second user data series. The parity concatenation means concatenates error correction parity bits to the second user data series based on user bits in the first and second user data series. The first user data series includes low-density parity check (LDPC) place holder bits. Interleave means for interleaving the error correction parity bits with one or more of the first and second user data series to generate a tensor-product code (TPC) encoder input signal is included. TPC encoder means for receiving the TPC encoder input signal and replacing the LDPC place holder bits with LDPC parity bits to generate an encoded signal is also included.

In still other features, the encoder system includes padding means for inserting zeroes within the first user data series. The TPC encoder means replaces the zeroes with the LDPC parity bits.

In other features, the error correction parity bits include Reed-Solomon parity bits.

In other features, the TPC encoder means generates the LDPC parity bits based on the first and second user data series and a generator matrix.

In other features, the TPC encoder means performs a bit-wise logical AND with the first and second user data series and entries in the generator matrix.

In yet other features, the TPC encoder means generates an encoded data stream based on a generator matrix $$G = \begin{bmatrix} I & G_p \\ 0 & \hat{G}' \end{bmatrix}.$$

The matrix $G_p$ is a non-low density matrix and the matrix $\hat{G}$ is a non-cyclical matrix. In other features, the matrix $G_p$ includes circulant matrices. In other features, the encoder system includes storing means for storing a selected row of each circulant of the matrix $G_p$. Encoding means for generating LDPC parity bits based on the selected row is included.

In other features, the encoder system wherein the encoding means derives remaining rows of the matrix $G_p$ based on the selected row.

In other features, the encoder system further includes encoding means that sets end bits of an interleave output of the interleave means to 0.

In other features, the encoder system includes LDPC parity bit generating means for generating a parity vector based on an interleave output of the interleave means and the matrix $G_p$. In other features, the LDPC parity bit generating means generates a binary vector based on the interleave output and the matrix $G_p$ and generates the parity vector based on the binary vector.

In other features, the matrix $\hat{G}'$ is nullified by setting user bits to 0.

In other features, the TPC encoder means cycles contents of a memory based on a truncation value prior to encoding an interleave output of the interleave means.

In further features, wherein an interleave output of the interleave means includes decoder output bits.

In other features, the matrix $G_p$ includes circulant matrices. In other features, the encoder system further includes storing means for storing a selected row of each circulant of matrix $G_p$. The TPC encoder means generates LDPC parity bits based on the selected row. In other features, the encoding means derives remaining rows of matrix $G_p$ based on the selected row.

In other features, the encoder system includes encoding means for setting end user bits of the received data stream to 0.

In other features, the encoder system includes LDPC parity bit generating means for generating a parity vector based on the received data stream and the matrix $G_p$. In other features, the LDPC parity bit generating means generates a binary vector based on the received data stream and the matrix $G_p$ and that generates the parity vector based on the binary vector.

In other features, the matrix $\hat{G}'$ is nullified by setting user bits to 0.

In other features, the TPC encoder means cycles contents of a memory based on a truncation value prior to encoding the received data stream.

In other features, the TPC encoder means receives and encodes decoded LDPC parity bits to generate expected LDPC parity bits.

In other features, the second user data series is concatenated to the first user data series.

In still other features, a low-density parity check (LDPC) decoder is provided and includes a decoded data stream generator that generates a decoded data stream based on a received data stream and a set of matrix-based codewords. The matrix-based codewords form a LDPC parity check matrix H. A decoder control module prewrites or replaces a selected portion of one or more of the codewords with zeros prior to generation of the decoded data stream.

In other features, the decoder control module replaces the selected portion. The selected portion has a truncation length that is less than or equal to a predetermined amount subtracted from β and then multiplied by C, where β represents a number of circulant columns within the parity check matrix H and C is a length of a circulant of the parity check matrix H.

In other features, the decoder control module replaces the selected portion, which has a truncation length that is less than or equal to $$\left(\beta - \frac{M}{C} - 1\right) * C,$$

where β represents circulant columns within the parity check matrix H with dimensions M×N and where M represents circulant rows, N represents columns and C is a length of a circulant of the parity check matrix H. In other features, $$\frac{M}{C}$$

columns of the parity check matrix H are not truncated. In other features, the last circulant column of the parity check matrix H is not truncated.

In yet other features, the LDPC decoder includes a truncation bit counter that initiates a count with respect to a predetermined circulant of the parity check matrix. The truncation bit counter increments along a row of the parity check matrix H to a second to last circulant in the row.

In other features, the decoder control module prewrites the selected portion, which has a puncture length that is less than or equal to C, where C is a length of a circulant of the parity check matrix H. In other features, the puncture length is divisible by symbol length. In other features, the LDPC decoder includes a puncture bit counter that initiates a count with respect to a circulant column. In other features, the puncture bit counter increments the count across the circulant column. In other features, the portion excludes likelihood ratio bits.

In other features, a method of operating a low-density parity check (LDPC) decoder includes generating a decoded data stream based on a received data stream and a set of matrix-based codewords. The matrix-based codewords form a LDPC parity check matrix H. Prewriting or replacing a selected portion of one or more of the codewords with zeros prior to generation of the decoded data stream is performed.

In further features, the method includes replacing the selected portion, which has a truncation length that is less than or equal to a predetermined amount subtracted from β and then multiplied by C, where β represents a number of circulant columns within the parity check matrix H and C is a length of a circulant of the parity check matrix H.

In other features, the method includes replacing the selected portion, which has a truncation length that is less than or equal to $$\left(\beta - \frac{M}{C} - 1\right) * C,$$

where β represents circulant columns within the parity check matrix H with dimensions M×N and where M represents circulant rows, N represents columns and C is a length of a circulant of the parity check matrix H. In other features, $$\frac{M}{C}$$

columns of the parity check matrix H are not truncated. In other features, the last circulant column of the parity check matrix H is not truncated.

In other features, the method includes initiating a count with respect to a predetermined circulant of the parity check matrix and increments along a row of the parity check matrix H to a second to last circulant in the row.

In other features, the method includes prewriting the selected portion, which has a puncture length that is less than or equal to C, where C is a length of a circulant of the parity check matrix H. In other features, the puncture length is divisible by symbol length. In other features, the method includes a puncture bit counter that initiates a count with respect to a circulant column. In other features, the puncture bit counter increments the count across the circulant column. In other features, the method includes wherein the portion excludes likelihood ratio bits.

In other features, a low-density parity check (LDPC) decoder is provided and includes decoded data stream generating means for generating a decoded data stream based on a received data stream and a set of matrix-based codewords. The matrix-based codewords form a LDPC parity check matrix H. Decoder control means for prewriting or replacing a selected portion of one or more of the codewords with zeros prior to generation of the decoded data stream is included.

In other features, the decoder control means replaces the selected portion, which has a truncation length that is less than or equal to a predetermined amount subtracted from β and then multiplied by C, where β represents a number of circulant columns within the parity check matrix H and C is a length of a circulant of the parity check matrix H.

In still other features, the decoder control means replaces the selected portion, which has a truncation length that is less than or equal to $$\left(\beta - \frac{M}{C} - 1\right) * C,$$

where β represents circulant columns within the parity check matrix H with dimensions M×N and where M represents circulant rows, N represents columns and C is a length of a circulant of the parity check matrix H. In other features, $$\frac{M}{C}$$

columns of the parity check matrix H are not truncated. In other features, the last circulant column of the parity check matrix H is not truncated.

In other features, the LDPC decoder includes truncation bit counting means for initiating a count with respect to a predetermined circulant of the parity check matrix. The truncation bit counting means increments along a row of the parity check matrix H to a second to last circulant in the row.

In other features, the decoder control means prewrites the selected portion, which has a puncture length that is less than or equal to C, where C is a length of a circulant of the parity check matrix H. In other features, the puncture length is divisible by symbol length.

In other features, the LDPC decoder includes a puncture bit counter that initiates a count with respect to a circulant column.

In yet other features, the puncture bit counter increments the count across the circulant column.

In other features, the portion excludes likelihood ratio bits.

In other features, a decoder system is provided and includes a tensor-product code (TPC) decoder that decodes a received data stream to generate a decoded signal. A mark module replaces low-density parity check (LDPC) parity bits of the decoded signal with 0s to generate a reset output signal. A deinterleave module that deinterleaves error correction parity bits that are within the reset output signal to generate a deinterleaved signal. The deinterleaved signal includes a decoded portion and a concatenated portion. The concatenated portion includes the error correction parity bits. A parity decoder module removes the concatenated portion from the deinterleaved signal.

In other features, the TPC decoder groups the error correction parity bits that are interleaved with user bits of the received data stream to generate a parity lead set. In other features, the TPC decoder groups LDPC parity bits of the received data stream. In other features, the TPC decoder groups error correction parity bits that are interleaved among the LDPC parity bits.

In further features, the error correction parity bits include Reed-Solomon parity bits.

In other features, the decoder system includes parallel processors that determine a maximum likelihood of odd parity error events of a predetermined number of framing boundaries. The TPC decoder generates the decoded signal based on the maximum likelihood.

In other features, the TPC decoder increments shift values of circulants across a block of columns within a current parity check matrix when a difference between first and second circulant values is less than or equal to a predetermined value to generate a new parity check matrix. The TPC decoder generates the decoded signal based on the new parity check matrix.

In other features, the TPC decoder increments shift values of circulants within a column of the second circulant value. In other features, the TPC decoder increments the shift values when the difference is less than or equal to the predetermined value and when a first circulant of the first circulant value is adjacent to a second circulant of the second circulant value.

In other features, the TPC decoder swaps circulants within a current parity check matrix when a difference between first and second circulant values is less than or equal to a predetermined value to generate a new parity check matrix. The TPC decoder generates the decoded signal based on the new parity check matrix.

In still other features, wherein a read-before-write constraint is applied during a search for code by the TPC decoder.

In other features, the decoder system includes memory and a receiving circuit. The receiving circuit caches received data until reception of a second synchronization mark that is received after an undetected first synchronization mark. The TPC decoder generates the decoded signal subsequent to reception of the second synchronization mark and based on the cached data. In other features, the receiving circuit begins caching the received data upon detection of a look for synchronization signal.

In other features, a decoder method is provided and includes decoding a received data stream to generate a decoded signal. Low-density parity check (LDPC) parity bits of the decoded signal are replaced with 0s to generate a reset output signal. Error correction parity bits that are within the reset output signal are deinterleaved to generate a deinterleaved signal that includes a decoded portion and a concatenated portion. The concatenated portion includes the error correction parity bits. The concatenated portion is removed from the deinterleaved signal.

In yet other features, the method includes grouping the error correction parity bits that are interleaved with user bits of the received data stream to generate a parity lead set. In other features, the method includes grouping LDPC parity bits of the received data stream. In other features, the method includes grouping error correction parity bits that are interleaved among the LDPC parity bits.

In other features, the error correction parity bits include Reed-Solomon parity bits.

In other features, the method includes determining a maximum likelihood of odd parity error events of a predetermined number of framing boundaries. The decoded signal is generated based on the maximum likelihood.

In other features, the method includes incrementing shift values of circulants across a block of columns within a current parity check matrix when a difference between first and second circulant values is less than or equal to a predetermined value to generate a new parity check matrix. The decoded signal is generated based on the new parity check matrix.

In other features, the method includes incrementing shift values of circulants within a column of the second circulant value. In other features, the method includes incrementing the shift values when the difference is less than or equal to the predetermined value and when a first circulant of the first circulant value is adjacent to a second circulant of the second circulant value.

In other features, the method includes swapping circulants within a current parity check matrix when a difference between first and second circulant values is less than or equal to a predetermined value to generate a new parity check matrix. The decoded signal is generated based on the new parity check matrix.

In other features, a read-before-write constraint is applied during a search for code by the TPC decoder.

In further features, the method includes caching received data until reception of a second synchronization mark that is received after an undetected first synchronization mark. The decoded signal is generated subsequent to reception of the second synchronization mark and based on the cached data. In other features, the method includes beginning cache of the received data upon detection of a look for synchronization signal.

In other features, a decoder system is provided and includes tensor-product code (TPC) decoding means for decoding a received data stream to generate a decoded signal. Mark means for replacing low-density parity check (LDPC) parity bits of the decoded signal with 0s to generate a reset output signal is included. Deinterleave means for deinterleaving error correction parity bits that are within the reset output signal to generate a deinterleaved signal that includes a decoded portion and a concatenated portion is also included. The concatenated portion includes the error correction parity bits. Parity decoder means for removing the concatenated portion from the deinterleaved signal is further included.

In other features, the TPC decoding means groups the error correction parity bits that are interleaved with user bits of the received data stream to generate a parity lead set. In other features, the TPC decoding means groups LDPC parity bits of the received data stream. In other features, the TPC decoding means groups error correction parity bits that are interleaved among the LDPC parity bits.

In yet other features, the error correction parity bits include Reed-Solomon parity bits.

In other features, the decoder system includes parallel processing means that determine a maximum likelihood of odd parity error events of a predetermined number of framing boundaries. The TPC decoding means generates the decoded signal based on the maximum likelihood.

In other features, the TPC decoding means increments shift values of circulants across a block of columns within a current parity check matrix when a difference between first and second circulant values is less than or equal to a predetermined value to generate a new parity check matrix. The TPC decoding means generates the decoded signal based on the new parity check matrix.

In other features, the TPC decoding means increments shift values of circulants within a column of the second circulant value. In other features, the TPC decoding means increments the shift values when the difference is less than or equal to the predetermined value and when a first circulant of the first circulant value is adjacent to a second circulant of the second circulant value.

In other features, the TPC decoding means swaps circulants within a current parity check matrix when a difference between first and second circulant values is less than or equal to a predetermined value to generate a new parity check matrix. The TPC decoding means generates the decoded signal based on the new parity check matrix.

In other features, a read-before-write constraint is applied during a search for code by the TPC decoding means.

In still other features, the decoder system includes storing means and receiving means for caching received data until reception of a second synchronization mark that is received after an undetected first synchronization mark. The TPC decoding means for generating the decoded signal subsequent to reception of the second synchronization mark and based on the cached data is included. In other features, the receiving means begins caching the received data upon detection of a look for synchronization signal.

In other features, a decoder memory system is provided that includes a first memory with at least a portion of a parity check matrix H. A second memory receives the portion from the first memory and is associated with a previous decoding iteration. A third memory communicates with the first memory, receives the parity check matrix H, and is associated with a current decoding iteration. A fourth memory includes likelihood ratios. A control module generates a LDPC decoded signal based on the parity check matrix H, the previous decoded iteration, and the likelihood ratios.

In other features, the second memory includes segregated portions, each of the segregated portions is associated with a group of rows in the parity check matrix H. In other features, the third memory includes segregated portions, each of the segregated portions is associated with a group of rows in the parity check matrix H. In other features, the fourth memory includes segregated portions.

In further features, the second memory includes rows, each of the rows includes a word. In other features, the word includes sequential multi-bit entries. In other features, the sequential multi-bit entries includes a first minimum bit log-likelihood ratio. In other features, the sequential multi-bit entries include a second minimum bit log-likelihood ratio. In other features, the sequential multi-bit entries include a parity check sign bit. In other features, the sequential multi-bit entries include an index. In other features, the sequential multi-bit entries include a parity checksum of hard decision bits. In other features, the hard decision bits indicate a valid codeword is detected. In other features, the hard decision bits indicate that decoding is complete for an iteration.

In other features, the first memory includes the parity check matrix H, which is stored as a series of offset values that indicate an index. In other features, the row index includes a non-zero entry along a leftmost column of a circulant of the parity check matrix H.

In other features, submatrices along a diagonal of the parity check matrix H share a common offset value.

In yet other features, the first memory includes only one row and one column of the parity check matrix H. In other features, the second memory and the third memory include words in a single row. In other features, a last word of the words includes empty memory cells when the word is indivisible by four (4).

In other features, a decoder path is provided that generates a decoded signal based on the decoder memory system.

In other features, a method of operating a decoder memory system is provided and includes receiving at least a portion of a parity check matrix H from a first memory via a second memory that is associated with a previous decoding iteration. The parity check matrix H is received via a third memory that is associated with a current decoding iteration. A control module generates a LDPC decoded signal based on the parity check matrix H, the previous decoded iteration, and likelihood ratios In other features, the second memory includes rows; each of the rows includes a word. The word includes sequential multi-bit entries. The sequential multi-bit entries include a parity checksum of hard decision bits. Valid codeword detection is indicated via the hard decision bits.

In still other features, the second memory includes rows; each of the rows includes a word. The word includes sequential multi-bit entries. The sequential multi-bit entries include a parity checksum of hard decision bits. Decoding completion, for an iteration, is indicated via the hard decision bits.

In other features, the method includes storing the parity check matrix H as a series of offset values that indicate a row index. In other features, the row index includes a non-zero entry along a leftmost column of a circulant of the parity check matrix H.

In other features, submatrices along a diagonal of the parity check matrix H share a common offset value.

In other features, the method includes generating a decoded signal based on the decoder memory system.

In yet other features, a decoder memory system is provided and includes first storing means, which includes at least a portion of a parity check matrix H. Second storing means for receiving the portion from the first storing means is included. The second storing means is associated with a previous decoding iteration. Third storing means for communicating with the first storing means is included. The third storing means receives the parity check matrix H and is associated with a current decoding iteration. Fourth storing means includes likelihood ratios. A control module generates a LDPC decoded signal based on the parity check matrix H, the previous decoded iteration, and the likelihood ratios.

In other features, the second storing means includes segregated portions; each of the segregated portions is associated with a group of rows in the parity check matrix H. In other features, the third storing means includes segregated portions; each of the segregated portions is associated with a group of rows in the parity check matrix H. In other features, the fourth storing means includes segregated portions.

In other features, the second storing means includes rows; each of the rows includes a word. In other features, the word includes sequential multi-bit entries. In other features, the sequential multi-bit entries includes a first minimum bit log-likelihood ratio. In other features, the sequential multi-bit entries include a second minimum bit log-likelihood ratio. In other features, the sequential multi-bit entries include a parity check sign bit. In other features, the sequential multi-bit entries include an index. In other features, the sequential multi-bit entries include a parity checksum of hard decision bits. In other features, the hard decision bits indicate a valid codeword is detected. In other features, the hard decision bits indicate that decoding is complete for an iteration.

In still other features, the first storing means includes the parity check matrix H, which is stored as a series of offset values that indicate a row index. In other features, the row index includes a non-zero entry along a leftmost column of a circulant of the parity check matrix H.

In other features, submatrices along a diagonal of the parity check matrix H share a common offset value.

In other features, the first storing means includes only one row and one column of the parity check matrix H. In other features, the second storing means and the third storing means comprise words in a single row. In other features, a last word of the words includes empty memory cells when the word is indivisible by 4.

In other features, a decoder path is provided that generates a decoded signal based on the decoder memory system.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 15 is a sample parity check matrix memory entry configuration according to an embodiment of the present disclosure;

FIG. 16 is a sample parity check matrix identifying diagonal shifting of within circulants thereof according to an embodiment of the present disclosure;

FIG. 17 is a sample of a memory entry configuration for an iteration of LDPC decoder processing according to an embodiment of the present disclosure;

FIG. 18 is a sample log-likelihood ratio memory entry configuration according to an embodiment of the present disclosure;

FIG. 19 is a sample of four (4) memory entries per word in the memory according to an embodiment of the present disclosure;

FIG. 20 is a sample parity check matrix illustrating a region of puncture according to an embodiment of the present disclosure;

FIG. 21 is a sample parity check matrix illustrating a region of truncation according to an embodiment of the present disclosure;

FIG. 23 is a parity check matrix diagram illustrating incrementation of a matrix column according to an embodiment of the present disclosure;

FIG. 24 is a decoding iteration diagram illustrating early termination according to an embodiment of the present disclosure;

FIG. 25 is a parity check matrix diagram illustrating a last circulant block column according to an embodiment of the present disclosure;

DETAILED DESCRIPTION

Figure 1:
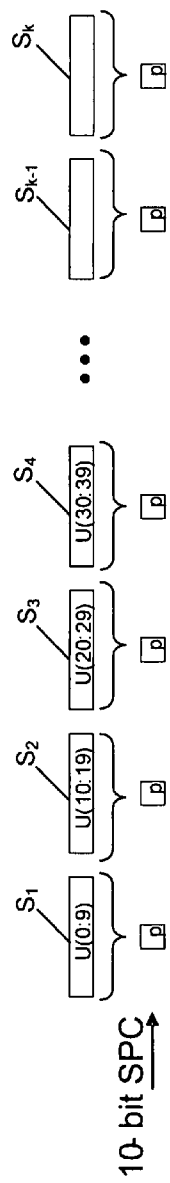
FIG. 1 is a sample 10-bit single parity check code according to the prior art.
Figure 2:
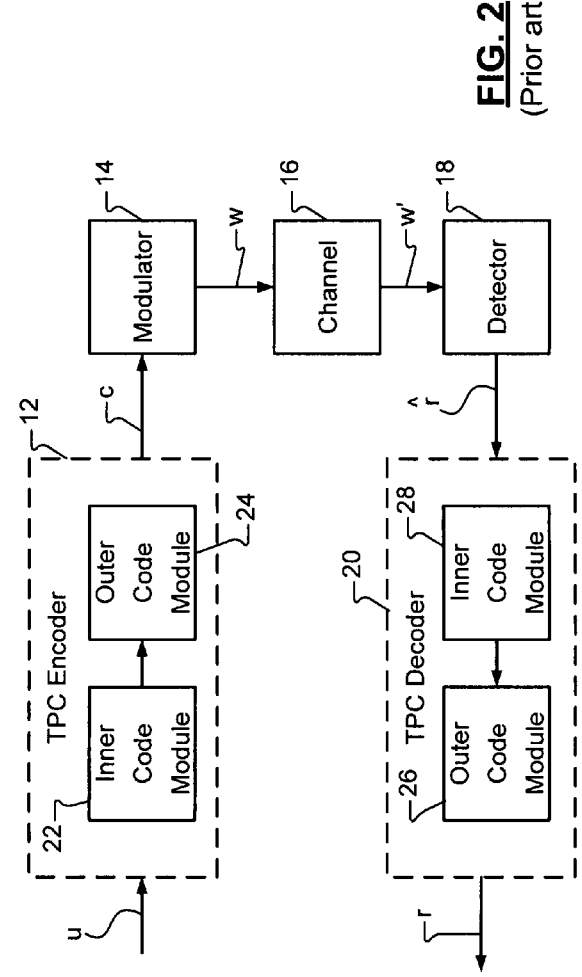
FIG. 2 is a functional block diagram illustrating a tensor product coded channel system according to the prior art.

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. Also and as used herein, the term stage refers to one or more modules. Additionally and as used herein, the phrase at least one of A, B, and C should be construed to mean a logical (A or B or C), using a non-exclusive logical or. It should be understood that steps within a method may be executed in different order without altering the principles of the present disclosure.

Figure 3:
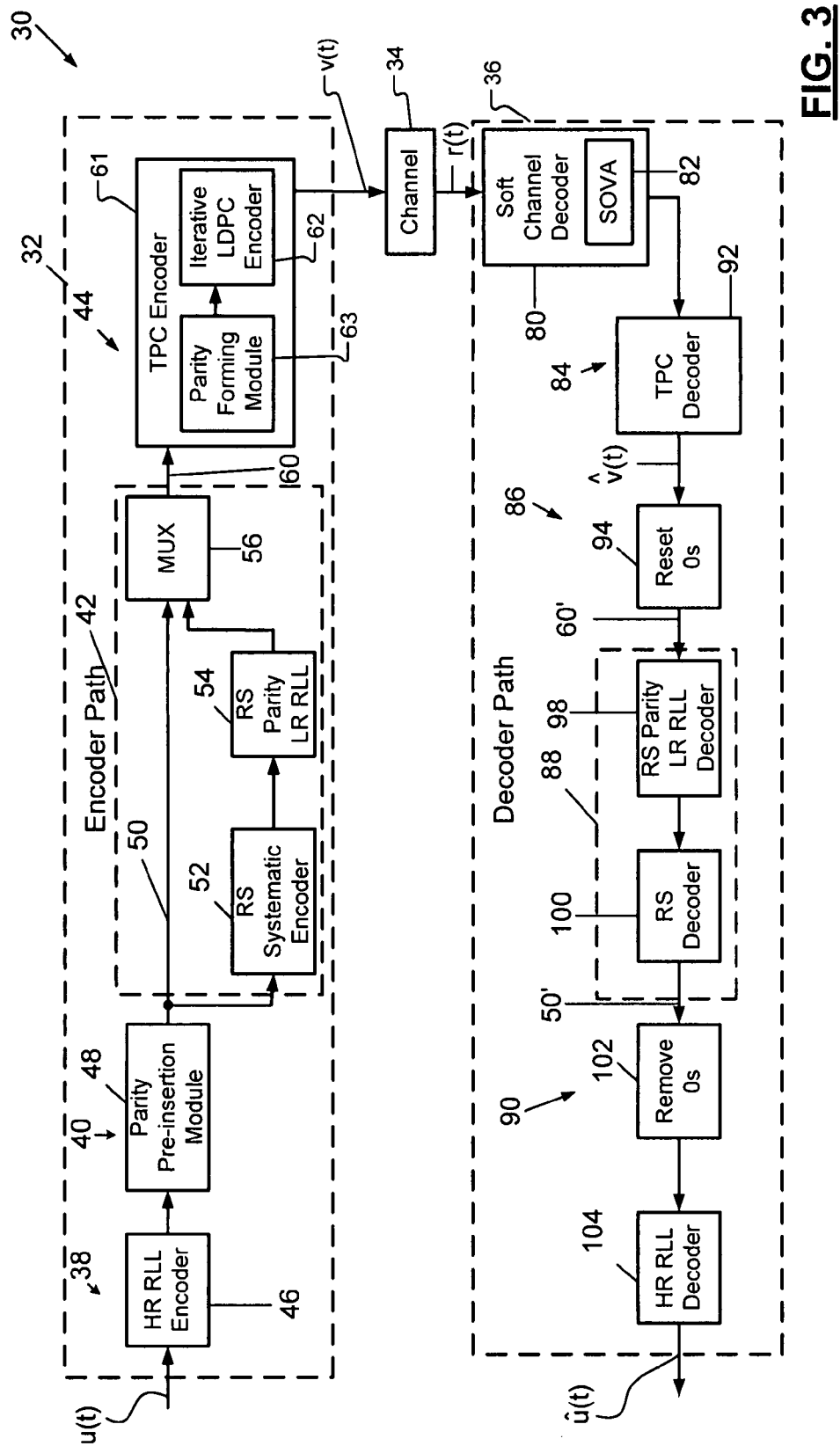
FIG. 3 is a functional block diagram illustrating a tensor-product coded channel system incorporating low-density parity check (LDPC) coding according to an embodiment of the present disclosure.
Figure 4:
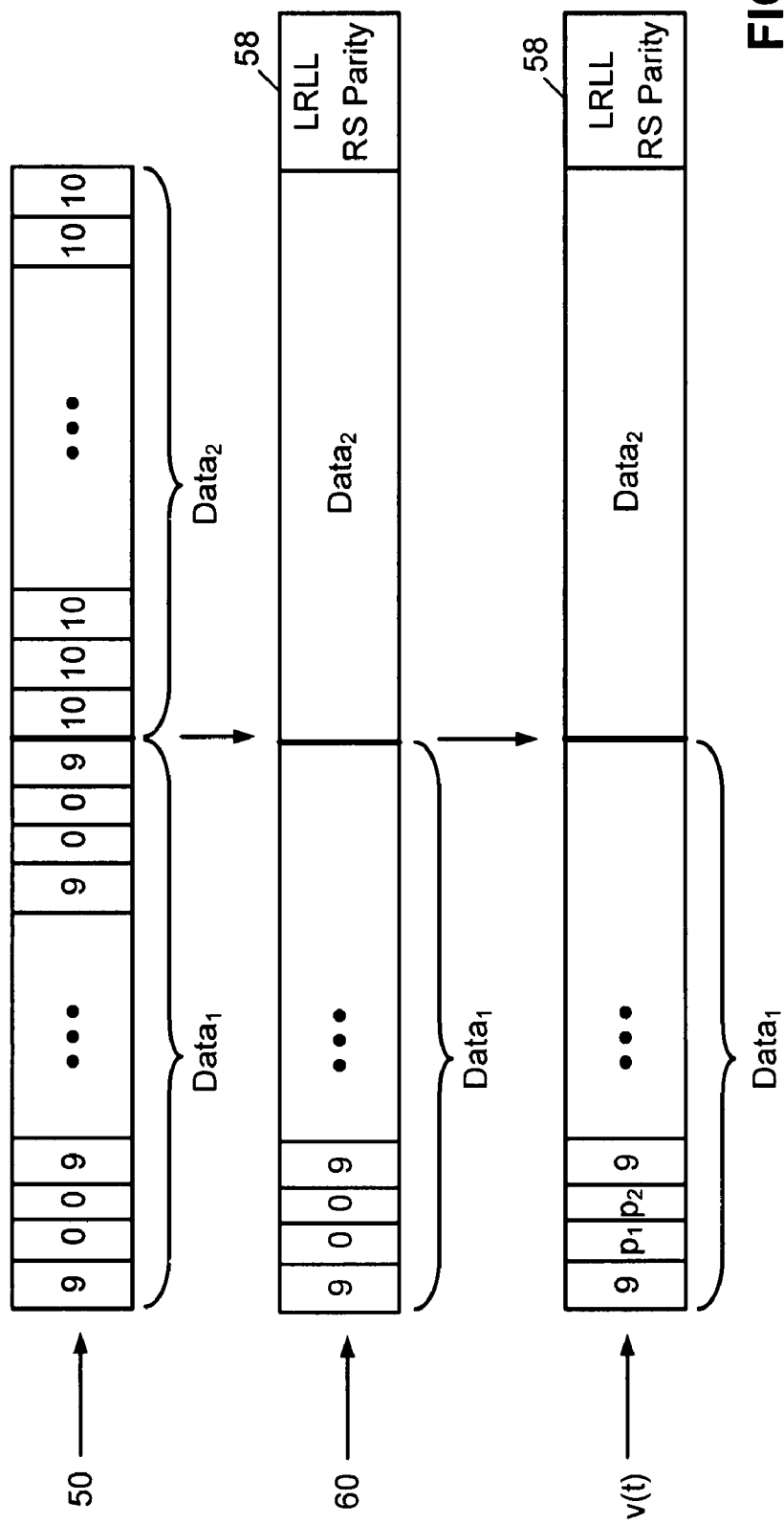
FIG. 4 is an encoder associated sector diagram according to an embodiment of the present disclosure.
Figure 5:
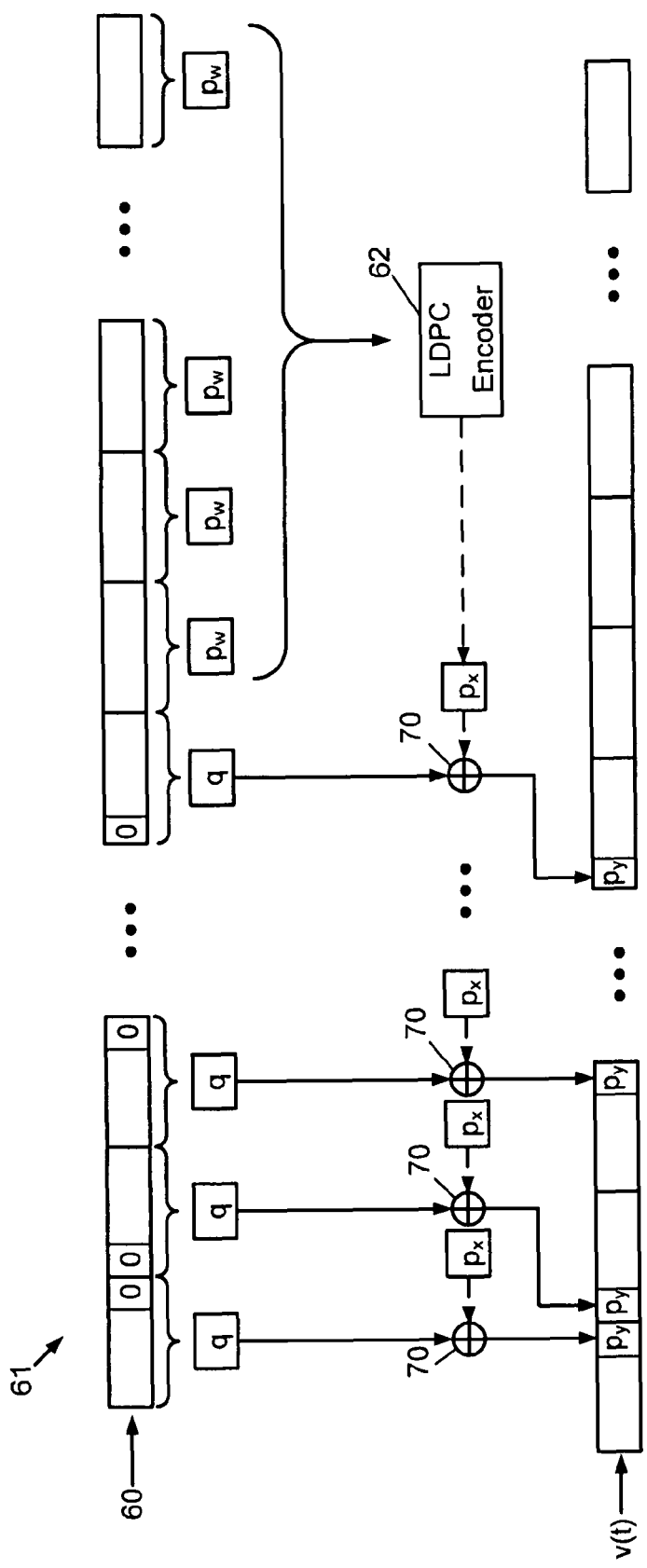
FIG. 5 is an tensor-product code encoder process diagram according to the prior art.

The embodiments disclosed below describe efficient very large scale integrator (VLSI) implementation architectures for tensor-product code (TPC) applications. For a further example description of a tensor-product code and a further example application for the use of a tensor-product code within a system see U.S. patent application Ser. No. 11/449, 066 entitled, "Tensor Product Codes Containing an Iterative Code", filed Jun. 7$^{th}$, 2006, which is incorporated herein by reference in its entirety. Referring now to FIGS. 3-5, a functional block diagram illustrating a tensor-product coded channel system 30 that performs LDPC coding, an encoder associated sector diagram and a TPC encoder process diagram are shown. The system 30 includes an encoder write/transmit path 32, a channel 34 and a decoder read/receive path 36, which may be referred to as tensor-product encoder and decoder paths. Data is encoded via the encoder path 32, stored on or transmitted through the channel 34, and read or received and decoded via the decoder path 36.

The encoder path 32 includes four encoder stages 38, 40, 42, 44, respectively. The first stage 38 receives information bits u(t) in the form of a data stream. The first stage 38 includes a high rate run length limited (HR RLL) encoder 46, which prevents long runs of no transitions, and can enforce some other constraints, e.g. direct current (DC) limited constraint.

The second stage 40 may divide the data stream u(t) into concatenated data streams, such as $data_1$ and $data_2$, respectively. The data stream u(t) may be divided into concatenated data streams during the fourth stage 44. The second stage 40 inserts dummy 0s in $data_1$ of the HR RLL coded data via a parity pre-insertion module 48. The 0s are inserted into locations corresponding to TPC redundancy bits, as shown in FIG. 4 as a second stage output, which is designated by numerical reference identifier 50.

The third stage 42 performs systematic Reed-Solomon (RS) Code encoding. The third stage 42 concatenates low rate run length limited (LR RLL) coded RS parity bits 58 to the $data_1/data_2$ series. This is done using an RS systematic encoder 52, a RS parity LR RLL encoder 54 and a multiplexer 56. The RS parity bits 58 are shown in FIG. 4 and a third stage output is designated by numerical reference identifier 60. Although LR RLL codes provide desired RS parity bits 58, they tend to have associated transmission rate losses.

The fourth stage 44 includes a TPC encoder 61 that has a parity forming module 63, which may be based on a LDPC inner code, and an iterative LDPC encoder 62. The TPC encoder 61 replaces the inserted zeros with LDPC parity bits $p_y$, such as $p_1$ and $p_2$ shown in FIG. 4. The TPC encoder 61 generates a fourth stage output v(t). In FIG. 5, the third stage output 60 is shown followed by the fourth stage output v(t). The bits associated with each symbol in $data_1$ of the third stage output 60 are XOR with each other to generate q-bits. The bits associated with each symbol in $data_2$ of the third stage output 60 are XOR with each other to generate a first set of LDPC parity bits, designated as $p_w$. The LDPC parity bits $p_w$ are received by a LDPC encoder 62, which provides the LDPC parity bits $p_x$, respectively, to XOR gates 70. The bits (q) are XOR with the respective LDPC parity bits $p_x$, as shown to generate a second set of parity bits or the parity bits $p_y$. The parity bits $p_y$ replace the zeros that are in the $data_1$ series. The LDPC encoder 62 provides the fourth stage output v(t), which is referred to as the LDPC encoded bits, to the channel 34.

The decoder path 36 includes a soft channel decoder 80, such as one with a soft output Viterbi algorithm (SOVA) detector 82, and like the encoder path 32, four decoder stages 84, 86, 88, 90. SOVA detector 82 decodes a received channel signal r(t) to recover the signal that was originally written or transmitted to the channel 34, such as the output signal v(t). This assumes that there are no error bits out of the SOVA detector 82. The SOVA detector 82 may determine the probabilities that a particular bit is a 1 or a 0 based on log-likelihood ratios (LLRs). A LLR is equal to the logarithm of: the probability that a bit is equal to one (1) divided by the probability that the bit is equal to zero (0).

The SOVA detector 82 determines LLRs for inner LDPC codeword bits of TPC, for example, in 10-bit intervals. Unlike a conventional LDPC code that protects user bits directly, the LDPC code in the TPC protects SPC parity check bits. The SPC parity check bits refer to the bitwise XOR of the user bits in each RS ECC symbol. The SOVA detector 82 generates a most likely odd number error event that would cause a change in the SPC parity checksum. The SPC parity checksum refers to the XOR of the user bits of the RS ECC symbols.

The four stages 84-90 correspond to the four stages 38-44. The resultant output signals of stages 84-90 are generated in reverse order than that of the stages 38-44. The fourth stage 84 includes a TPC decoder 92, which decodes the LDPC code and provides a TPC decoded output series $\hat{v}(t)$ that is similar to the output signal v(t).

The third stage 86 includes a reset zeros module 94, which replaces the LDPC parity bits with 0 bits, and provides a reset 0s output series 60' that is similar to the third output 60. The second stage 88 includes a RS parity LR RLL decoder 98 and a RS decoder 100, which provide an output series 50' that is similar to the second stage output 50. The first stage 90 includes a remove 0s module 102 that removes the 0s that were placed by the pre-insertion module 48. A HR RLL decoder 104 is coupled to the remove 0s module 102 and provides the decoded output signal $\hat{u}(t)$ that is similar to or the same as the originally received information bits u(t).

Figure 6:
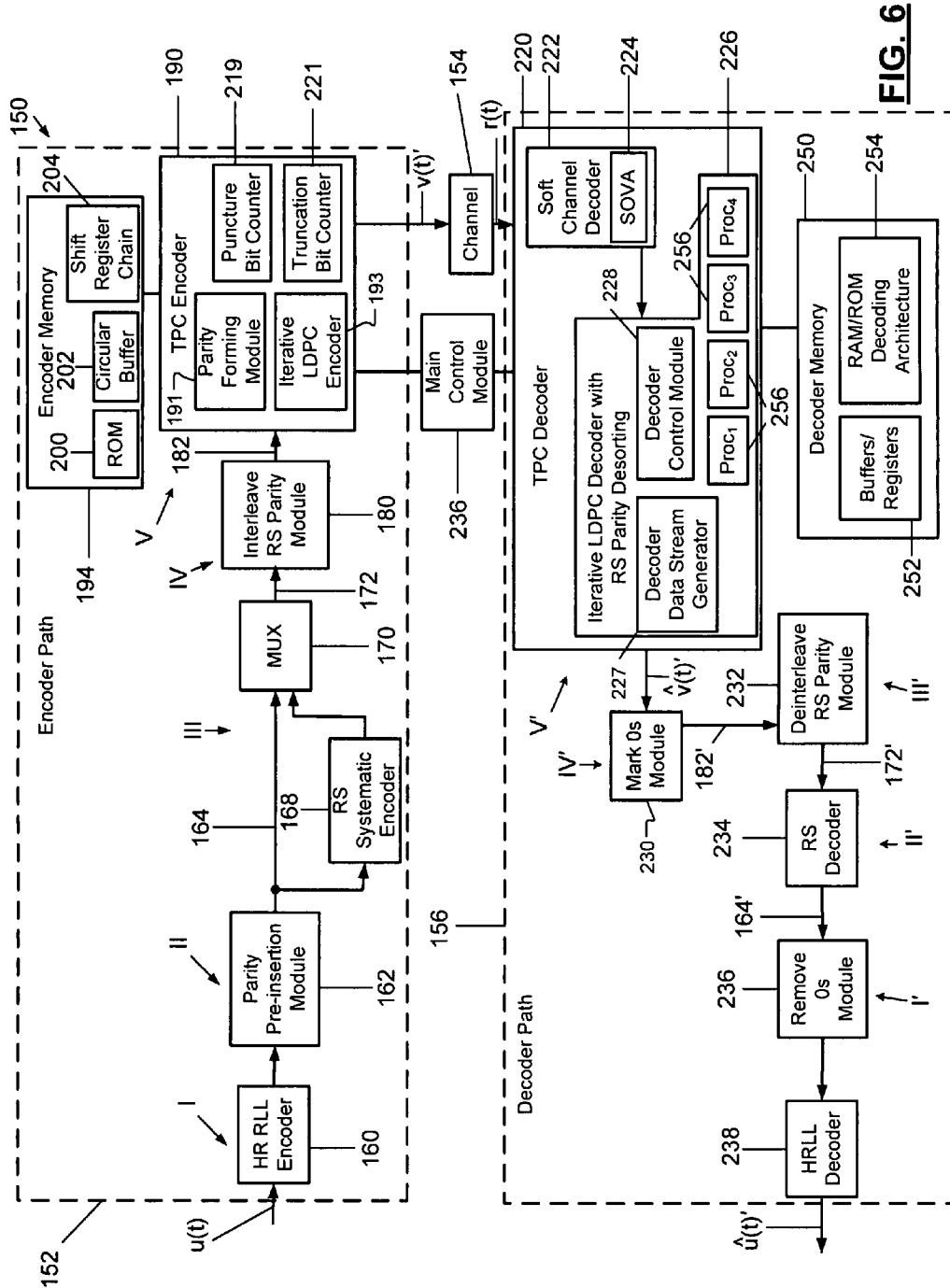
FIG. 6 is a functional block diagram illustrating a tensor-product coded channel system incorporating a tensor-product code decoder according to an embodiment of the present disclosure.

Referring to FIG. 6, a functional block diagram illustrating a tensor-product coded channel system 150 that incorporates a TPC decoder is shown. The system 150 includes an encoder write/transmit path 152, a channel 154 and a decoder read/receive path 156. The encoder and decoder paths 152 and 156 include and are formed of multiple encoder and decoder modules. Data is encoded via the transmit path 152, stored on or transmitted through the channel 154, and read or received and decoded via the receive path 156.

The encoded path 152 includes essentially five encoder stages I-V. The first stage I receives information bits u(t) in the form of a data stream. An example of two concatenated data streams data$_1$, data$_2$ are shown. The first stage I includes a HR RLL encoder 160.

Figure 7:
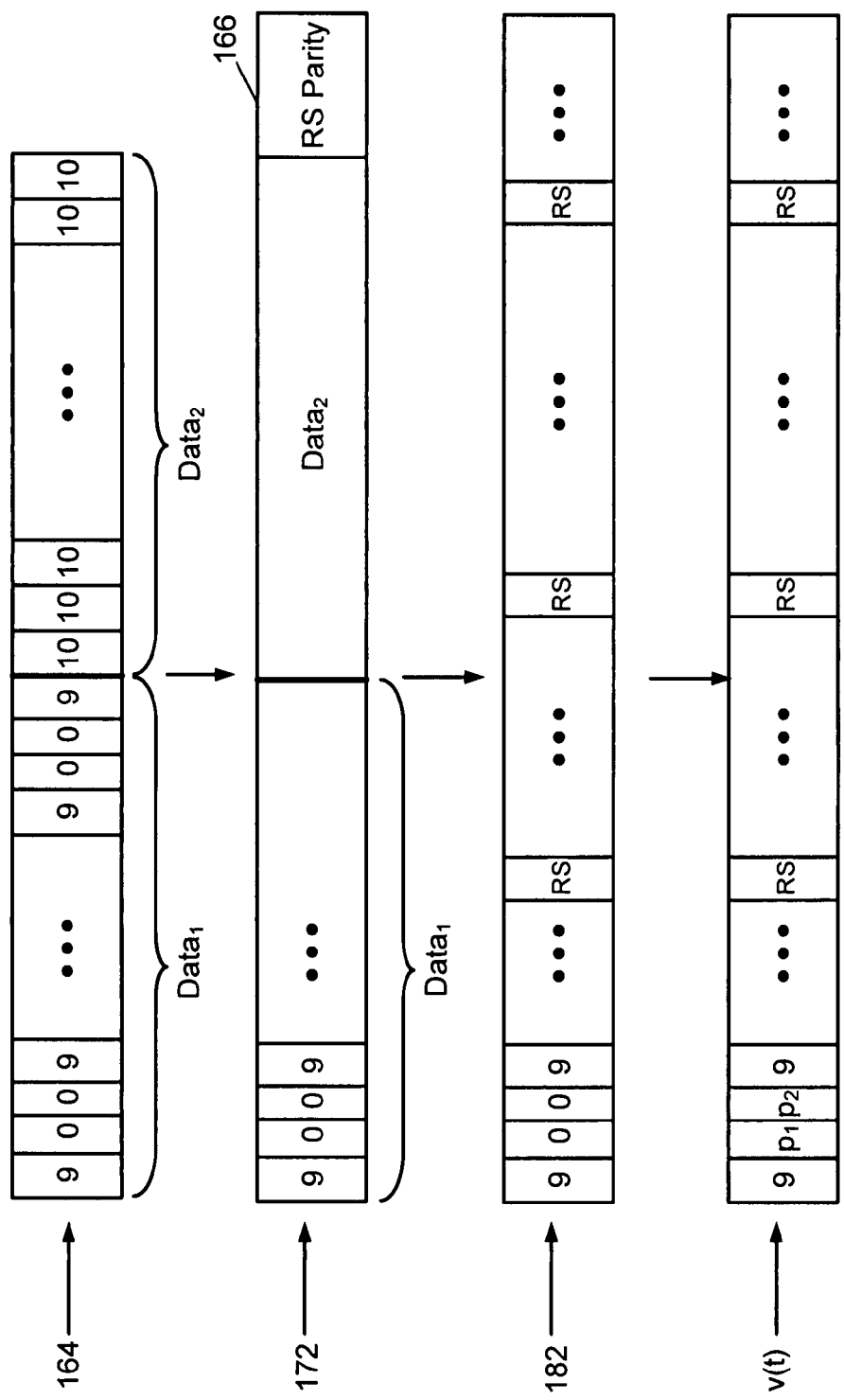
FIG. 7 is an encoder associated sector diagram according to an embodiment of the present disclosure.

The second stage II inserts dummy 0s into the HR RLL coded data from the HR RLL encoder 160 via a parity pre-insertion module 162. The 0s are inserted into locations corresponding to TPC redundancy bits, and are replaced downstream by parity bits. Output of the parity pre-insertion module is shown in FIG. 7 and is designated 164. Although the second stage output 164 is shown as a series of 10-bit symbols, the symbols may contain any number of bits.

The third stage III performs systematic RS Code encoding via a RS systematic encoder 168, which may be referred to as a parity generation module, to generate RS ECC parity bits/symbols 166. The RS ECC parity bits/symbols 166 are concatenated to the data streams data$_1$, data$_2$ via the multiplexer 170, which may be referred to as a parity concatenation module, in a consecutive manner. The RS ECC parity symbols 166 are interleaved with the second stage output 164 to form a RS ECC encoder output stream 182.

The fourth stage IV includes an interleave RS parity module 180, which may be referred to as a parity insertion module, that interleaves the RS parity bits concatenated in the third stage III throughout the data$_1$/data$_2$ series, as shown by a fourth stage output 182. The fourth stage output 182 may be referred to as an interleaving data series output or a LDPC encoder input signal. The spreading of the RS parity bits throughout the data$_1$/data$_2$ series or the spreading of RS parity symbols throughout a sector loosens an HRLL constraint that can be associated therewith. In other words, it is less likely that there is a series of 0s or a series of 1s, which do not satisfy the HRLL constraint, due to the addition of the RS symbols. The location of the RS parity bits in the data$_1$/data$_2$ series may be stored by the RS parity module 180 and/or some other module of the encoder path 152. The RS party bit locations may be accessed by the decoder path 156, as described below.

The fifth stage V includes a TPC encoder 190 that has a parity forming module 191 and an iterative LDPC encoder 193. In this embodiment, the TPC is based on an inner LDPC code. The TPC encoder 190 replaces the inserted 0s with LDPC parity bits p$_y$, as shown by the fifth stage output v(t)'. The fifth stage output v(t)' may be referred to as TPC encoded bits. Example LDPC parity bits p$_1$ and p$_2$ are shown. See FIG. 5 for an example of how the parity bits p$_x$ and p$_y$ may be generated. The TPC encoder 190 provides the LDPC encoded bits v(t) to the channel 154.

Consider an (n,k) LDPC code C where n is the code length and k is the information length. The parity check matrix H may be a m-by-n matrix of the LDPC code C, wherein m≧n−k. Without loss of generality, it is assumed that the parity check matrix H satisfies equation 1, where H$_u$, H$_p$ are submatrices of the parity check matrix H corresponding to user data and parity bits, respectively.

$$H=[H_u, H_p] \qquad (1)$$

When c is a codeword in the LDPC code C, then Hc=0. For systematic encoding, where no user bits are changed during encoding, c=(u,p). When the parity bit matrix H$_p$ is of full rank, such as when all rows of the parity bit matrix H$_p$ are dependent rows, then a two step encoding procedure may be implemented. The two steps include computing H$_u$u, where u is a vector of user bits and computing parity bits p according to equations 2 and 3.

$$p=H_p^{-1}(H_u u) \qquad (2)$$

$$H_p p + H_u u = 0 \qquad (3)$$

Alternatively, a k-by-n generator matrix G as shown by equation 4 may be used in generating LDPC encoded bits v(t).

$$G=[I_u, G_p] \qquad (4)$$

The systematic encoding may be carried out as provided by equation 5.

$$c=uG=(u, uG_p) \qquad (5)$$

When H is quasi-cyclic, then an efficient hardware based encoder may be designed. Again when H$_p$ is of full rank then H$_p^{-1}$ exists and is also quasi-cyclic. This simplifies storage requirements for an encoder. Similarly, when an encoder is implemented via the generator matrix G, the parity bit generator matrix G$_p$ is also quasi-cyclic. The parity bit generator matrix G$_p$ is a k-by-(n-k) matrix.

Figure 8:
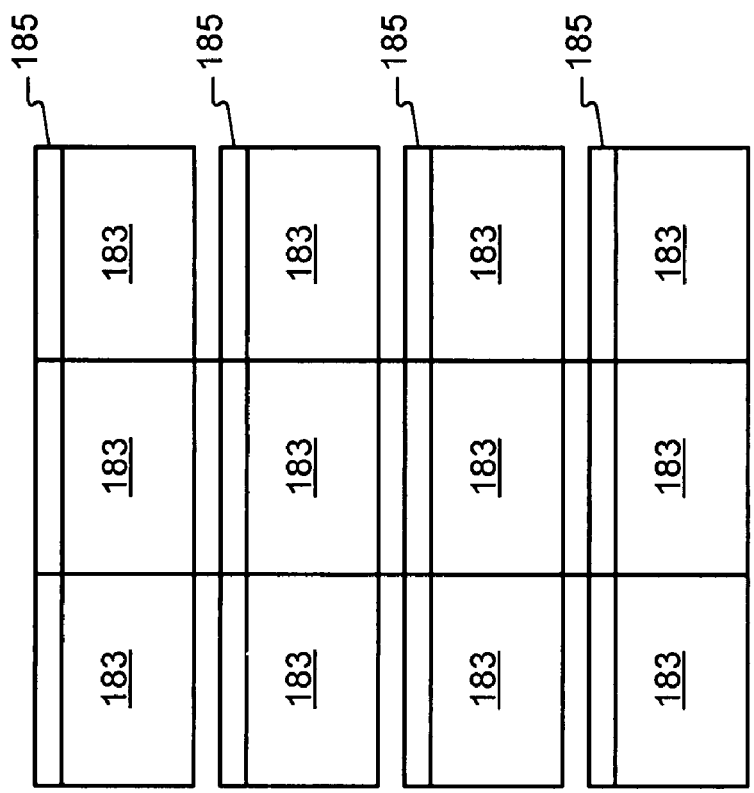
FIG. 8 is a view of a parity generator matrix according to an embodiment of the present disclosure.

By letting length of c be equal to a circulant size, the parity bit generator matrix G$_p$ has k/c rows of circulants and (n-k)/c columns of circulants. Each row of circulants is fully represented by the first row of bits in each circulant. Example circulants and first rows are shown in FIG. 8 and designated 183, 185, respectively. An example implementation of uG$_p$ is provided below with respect to FIG. 9, where initially the parity bits are 0s.

The TPC encoder 190, in generating the LDPC encoded bits v(t), utilizes a generator matrix G. The generator matrix G is stored in memory, such as an encoder memory 194. The generator matrix G can be represented as provided by expression 6 where matrices $\tilde{G}$ and $\hat{G}$ represent the upper and lower portions of the matrix G. Likewise, the matrix G can also be divided into four quadrants having an identity matrix I, a matrix of 0s, and right side upper and lower matrices G$_p$ and $\hat{G}'$.

$$G = \begin{bmatrix} \tilde{G} \\ \hat{G} \end{bmatrix} = \begin{bmatrix} I & G_p \\ 0 & \hat{G}' \end{bmatrix} \quad (6)$$

The matrix G can also be expressed relative to user bits or a user vector ũ and associated LDPC parity bits or a parity vector p̃, as provided in expression 7. It is further noted that the matrix G satisfies expression 8.

$$[\tilde{u}\tilde{p}] = \tilde{u} \square_G \quad (7)$$

$$HG^T = \vec{0} \quad (8)$$

Figure 9:
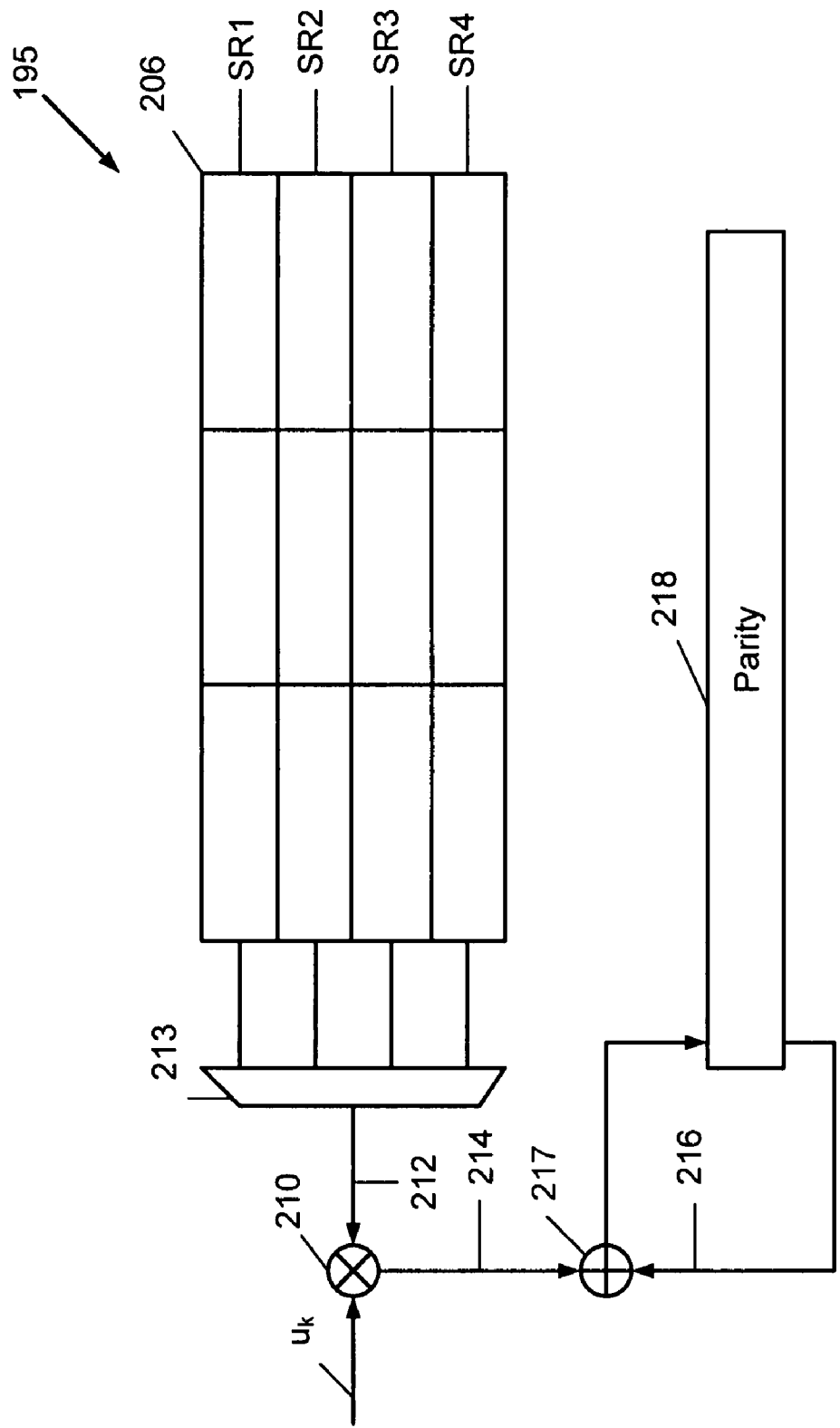
FIG. 9 is an LDPC encoder diagram illustrating parity bit generation according to an embodiment of the present disclosure.

Referring also to FIG. 9, an LDPC encoder diagram illustrating a parity bit generator 195 that generates parity bits is shown. The matrix $G_p$ may be a γ×3 grid of C×C square circulant matrices by construction, where γ is equal to the number of circulants per column less the number of circulants per row in a corresponding parity check matrix H of a decoder path, which is described in further detail below. A circulant refers to a matrix that has C rows and C columns. The matrix $G_p$ is said to not be of low density since it has many 1s.

The first row of each circulant of the matrix $G_p$ is stored in the encoder memory 194, such as a read only memory (ROM) 200 and/or a circular buffer 202 having shift registers 204, as a single binary word. An example circular $G_p$ buffer architecture 206 is shown in FIG. 9. The memory 194 is read when the LDPC encoding process proceeds into a new or subsequent circulant of the matrix $G_p$. The circular $G_p$ buffer architecture 206 shows matrix $G_p$ divided along the circulant boundaries. Rows within each cell of the circular $G_p$ buffer architecture 206 are cyclically shifted. Hence, the architecture loads the first row of each circulant (for the embodiment described three circulants total each time) into the shift registers 204. The shift registers 204 are used to shift and obtain subsequent rows. After the first C rows, a new row corresponding to the first row of the next trio of circulants is loaded into the 3 shift register chains, and the process is repeated.

In use, the TPC encoder 190 performs a bitwise logical AND, designated 210, with each entering user bit $u_k$ and a vector of binary bits 212 from the corresponding row in the matrix $G_p$. The bits in one of the four registers SR1-SR4 are multiplexed, via a multiplexer 213 to provide the vector of binary bits 212. The vector result 214 out of the logical AND 210 is bitwise XOR, with an accumulating parity bit vector 216. The XOR is denoted as 217. A final parity vector result 218 is obtained after the last user bit is used in replacing the zeros inserted into the data$_1$/data$_2$ series generated in the first stage I.

The matrix Ĝ' has $\hat{G}_r'$ rows and $\hat{G}_c'$ columns, where $\hat{G}_r'$ is equal to [M-(N-K)] and $\hat{G}_c'$ is equal to 3C or the number of rows of the parity check matrix H multiplied by the circulant size C. Thus, the matrix Ĝ' is a [M-(N-K)]×3C matrix. Of course, the matrix Ĝ' may have any number of columns. M is the number of circulant rows of the parity check matrix H. N is the number of columns of the parity check matrix H. K is the number of information bits within a row of the parity check matrix H.

The design may be simplified by setting the last predetermined amount of user bits, for example the last two user bits, equal to zero. In such a simplification, the contribution from the matrix Ĝ' is ignored. The matrix Ĝ' is equal to zero when the parity check matrix H is full ranked or no further Gaussian elimination can be performed. The matrix Ĝ' is ignored, as opposed to performing Gaussian elimination, which can result in the geometrical properties, such as having circulant sub-matrices, shifted diagonals, etc., of the parity check matrix H being lost. In another embodiment, the encoding process is constrained, while the decoding process uses a full code for decoding. In other words, the decoding process ignores the two bits that are set to zero in the encoding process.

Alternatively, the generator matrix G may be "near" quasi-cyclical. See Z. Li, L. Chen, L Zeng, S. Lin, and W. H. Fong, "Efficient Encoding of Quasi-Cyclic Low-Density Parity-Check Codes", IEEE trans. Commun., vol. 54, No. 1, pp. 71-81, January 2006. The generator matrix upper portion G̃ is quasi-cyclic and the generator matrix lower portion Ĝ' may not have any cyclical property by code construction.

The largest sub-code C̃ of the LDPC code C that has a generator matrix upper portion G̃ that is quasi-cyclic is determined. Once the generator matrix upper portion G̃ is determined, then the generator matrix G may be written as provided in equation (6), wherein the generator matrix lower portion G contains bases of $$\frac{G}{\tilde{G}}.$$

To start, the parity check matrix H as provided in equation 1 is used, where $H_p$ is the smallest quasi-cyclic sub-matrix of the parity check matrix H. The rank of the sub-matrix $H_p$ is equal to that of the parity check matrix H. The sub-matrix $H_p$ is not unique.

A fundamental property of the generator matrix upper portion G̃ is provided by equation 9.

$$\tilde{G} = [I_u, G_p] \quad (9)$$

$$H\hat{G}^T = 0 \quad (10)$$

$$H_p \tilde{G}_p^T = H_u \tilde{G}_u^T = H_u I_u = H_u \quad (11)$$

The targeted circulant size of the generator matrix upper portion G̃ is the same as that of the parity check matrix H. For each row of circulants in the generator matrix upper portion G̃ it is sufficient to find the first row g̃, as provided by equation 12.

$$\tilde{g} = [\tilde{g}_u, \tilde{g}_p] \quad (12)$$

The elements of $\tilde{g}_p$ corresponding to dependent columns of the sub-matrix $H_p$ are set to 0, equivalently dependent columns of the sub-matrix $H_p$ are set to 0. Thus, the number of unknowns in $\tilde{g}_p$ coincides with the rank of the sub-matrix $H_p$ and expression 13 is satisfied.

$$H_p \tilde{g}_p^T = h_u \Longrightarrow \tilde{g}_p^T = \tilde{H}_p^{-1} h_u \quad (13)$$

The generator matrix upper portion G̃ is obtained by expanding the first row of each circulant. Each subsequent row is obtained by cyclically shifting the previous row one position to the right. The generator matrix upper portion G̃ is circular and equation 10 is satisfied. However, the rank of the generator matrix upper portion G̃ is less than k. The rank of the generator matrix upper portion G̃ is equal to the rank of the sub-matrix $H_p$. See equation 14.

$$k - \text{rank}(\tilde{G}) = m - \text{rank}(H_p) \quad (14)$$

The generator matrix lower portion Ĝ is not quasi-cyclic, however parts of the generator matrix lower portion Ĝ may have quasi-cyclic like structures. When two or more independent columns are consecutive, then the rows of the generator matrix lower portion Ĝ corresponding to the consecutive independent columns would be a circular shift of each other. The overall encoder architecture is similar to that provided in FIG. 9. However, some buffers are added to store the rows of the generator matrix lower portion $\hat{G}$.

When m=n−k+1 then l*m bits in the generator matrix lower portion $\hat{G}$ are stored. l is the number of non-systematic information bits. For example, for a parity check matrix H that is 336-by-1008, when n−k=334, then 2*336 bits are stored.

When the number of non-systematic information bits is small, such as for example two (2) non-systematic information bits, then encoding is performed via the generator matrix upper portion $\tilde{G}$ and not the generator matrix lower portion $\hat{G}$ for the subcode. Decoding is performed using the original parity check matrix H. The original code in the previous example is (1008, 674), which becomes (1008, 672). The 672 information bits are encoded and 336 parity bits are appended in the associated subcode to form the codeword. For this reason, extra bits in the last 2 rows of the original generator matrix G are not stored. Miscorrection probability is the same as the original code.

Figure 10:
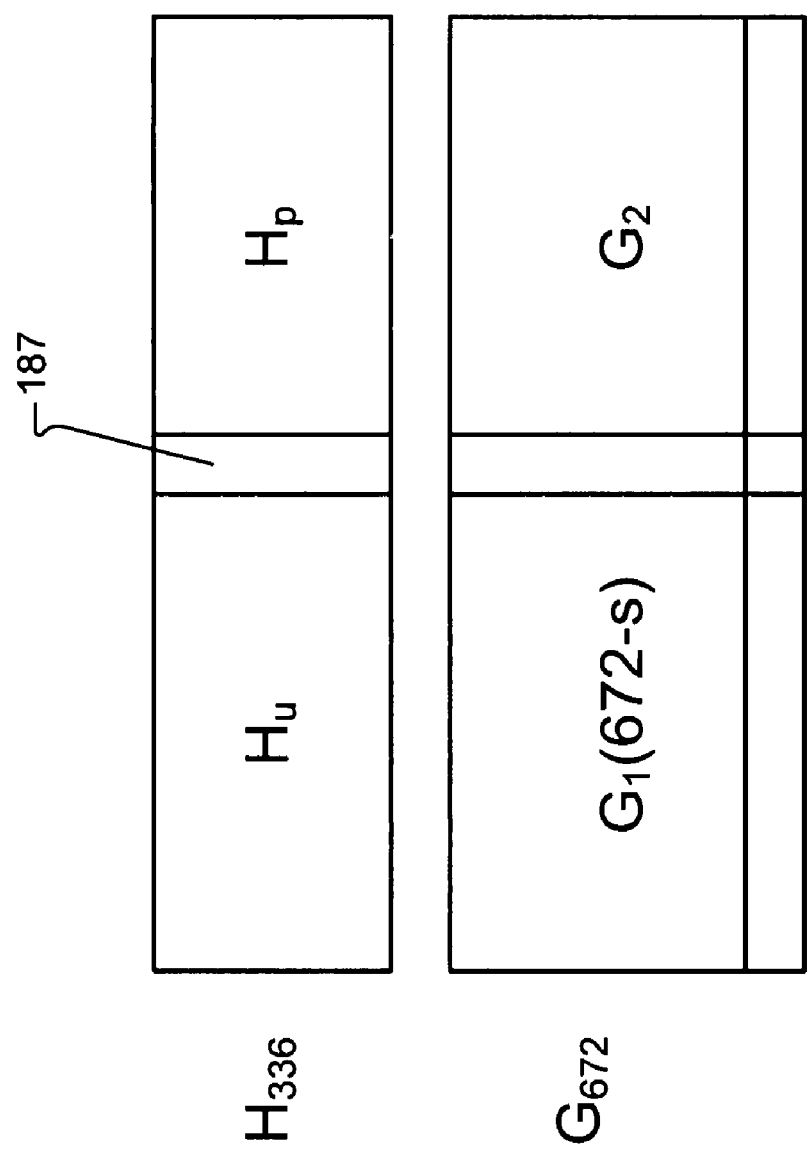
FIG. 10 is a view of a parity check matrix and a generator matrix according to an exemplary embodiment of the present disclosure.

The constructed LDPC codes may be longer than the maximum block length needed. However, because the encoder and decoder matrices are quasi-cyclic, there is not a loss in storing the original generator matrix G. FIG. 10 shows the parity check matrix H and the generator matrix G. The shaded area 187 represents unused bits, which may be considered as 0s. The unused bits may be punctured. In FIG. 10, $G_1$ may represent an identity matrix that has s-unused rows and $G_2$ is a second or right portion of the generator matrix G.

The TPC encoder 190 may also have a puncture bit counter 219 and a truncation bit counter 221 for puncture and truncation purposes, which are below described. Puncture and truncation may be performed during the LDPC encoder process to adjust the effective code rate and the sector length of associated memory.

Referring again to FIGS. 6 and 7, the decoder path 156 includes a receive channel processing circuit, which for the described embodiment is referred to as a TPC decoder 220. The TPC decoder 220 includes a soft channel decoder 222, such as one with a soft output Viterbi algorithm (SOVA) detector 224, and a TPC decoder 220. The TPC decoder 220 may have a decoder data stream generator 227 or a decoder control module 228, which may be one in the same. The decoder path 156 has five decoder stages I'-V', that provide similar output as the five encoder stages I-V. The SOVA detector 224 decodes a received channel signal r(t)' from the channel 154 to allow for recovery of that which was originally written or transmitted to the channel 154, such as the fifth stage output v(t)'. The TPC decoder 220 provides the TPC decoded output or fifth stage output v̂(t) that is similar to or the same as the fifth stage output v(t)'.

A SOVA detector 224 determines LLRs for inner LDPC codeword bits of TPC. The LDPC code in the TPC protects SPC parity check bits. In addition to generating an LLR for each parity bit, the SOVA detector 224 also generates most likely odd number error event (mask as well as error location within the symbol) that would cause change in parity checksum. For more information regarding LLR computations for parity bits see U.S. patent application Ser. No. 11/518,020, filed on Sep. 8, 2006, entitled "Error Pattern Generation for Trellis-based detection and/or decoding", which is incorporated herein by reference in its entirety.

Once LLRs for LDPC codewords are computed, the five decoder stages I'-V' are performed and correspond to the five encoder stages I-V. The resultant output signals of stages I'-V' are generated in reverse order than that of the stages I-V. The fifth stage V' of the decoder path 156 includes the TPC decoder 226. The fifth stage V' decodes the TPC and provides the output series v̂/(t)'. The fourth stage IV' includes a mark 0s module 230, which replaces the LDPC encoder parity bits of the LDPC decoder output series v̂(t)' with 0s prior to RS ECC decoder 234. The fourth stage IV' provides a reset 0s output signal or fourth decoder stage output 182' that is similar to or the same as the fourth stage encoder output 182.

The third stage III' includes a deinterleave parity module 232 that removes the RS parity bits from their locations among the user bits of the output series 182'. The RS parity bits are pulled out of the data stream and concatenated to the end of a decoded portion of the data stream to form a RS parity concatenated portion. The combined decoded portion and the concatenated portion form a deinterleaved RS parity combined output 172'. The combined output or third stage decoder output 172' is similar to or the same as the third stage encoder output 172. The deinterleave process is based on stored locations and/or known separation distances between the RS parity bits. The stored locations and separation distances, as well as other information, may be shared between the encoder path 152 and the decoder path 156 via a main control module 236 or via some other module or communication interface.

The second stage II'' includes a parity decoder module, shown as a RS decoder 234, which removes the concatenated RS parity bits to provides a user data output 164'. The user data output or second stage decoder output 164' is similar to or the same as the second stage encoder output 164. The first stage I' includes a remove zeros module 236, which removes the zeros that were inserted in the first stage I. A HR RLL decoder 238 is coupled to the remove zeros module 236 and generally provides the originally received information bits, denoted û(t), which were received and encoded by the encoder path 152.

The TPC decoder 220 includes a LDPC decoder 226. The TPC decoder 220, the soft channel decoder 222 and/or the LDPC decoder 226 may have, as shown, an associated decoder memory 250 and a RAM/ROM decoding architecture 254. The memory 250 has buffers/registers 252. A detailed example of the decoding architecture 254 is shown and described with respect to FIG. 14. Also, the LDPC decoder 226 may have multiple associated processors. As an example, the LDPC decoder 226 is shown with four parallel processing units 256. The use of parallel processors increases the throughput of the LDPC decoding process. See descriptive embodiments with respect to FIGS. 14-19.

Figure 11:
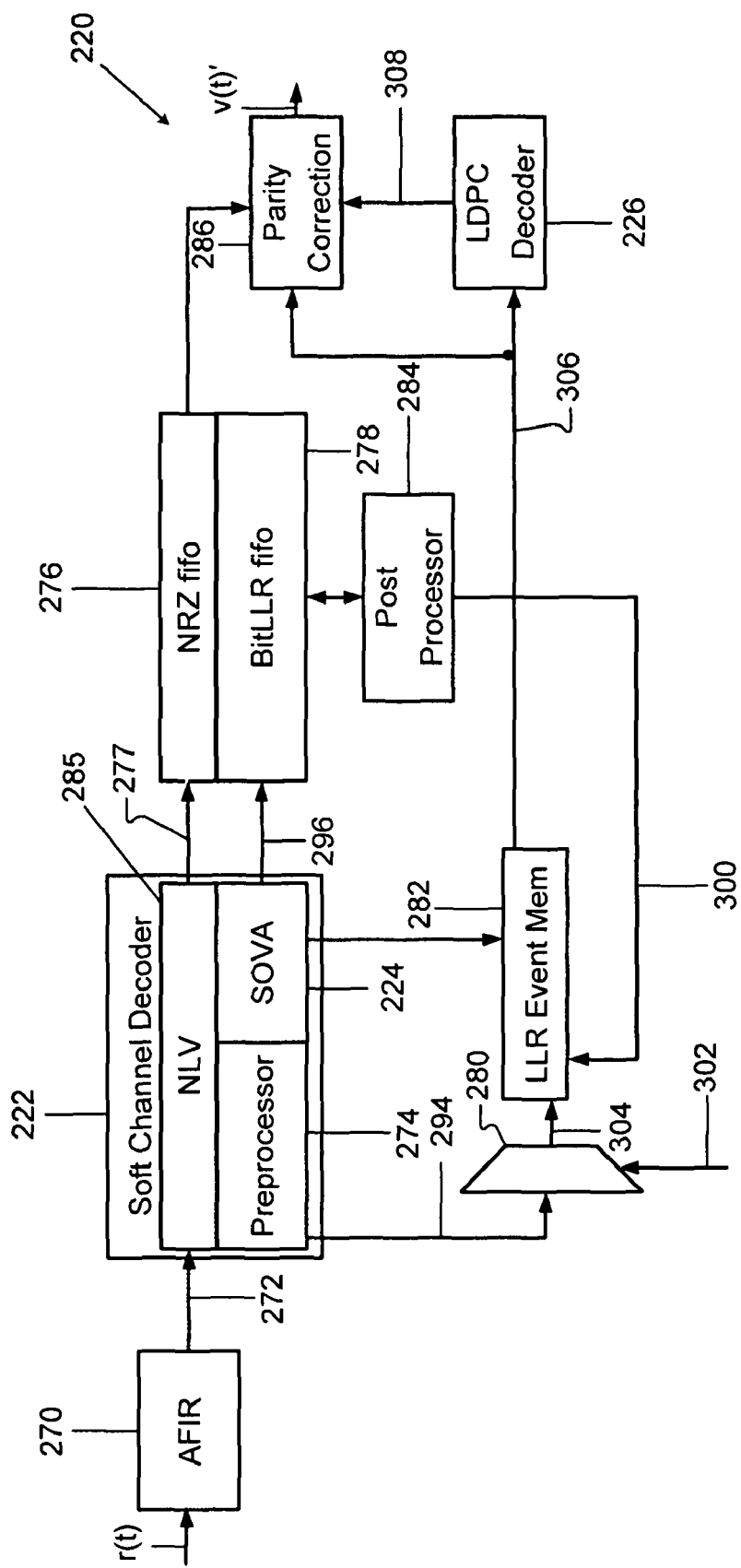
FIG. 11 is a receive channel processing circuit diagram according to an embodiment of the present disclosure.

Referring to FIG. 11, a receive channel processing circuit diagram is shown. The receive channel circuit 220 includes an adaptive finite impulse response (AFIR) filter 270 that receives the channel data samples r(t) and generates an equalized data signal 272. The AFIR 270 is coupled to a preprocessor 274, which in turn is coupled to a non-return-to-zero (NRZ) first in first out (fifo) memory 276, a bit log-likelihood ratio (LLR) fifo memory 278, a multiplexer 280 and a LLR event memory 282. The bit LLR memory 278 is coupled to a postprocessor 284, which is in turn is coupled to the LLR event memory 282. The NRZ fifo 276 is coupled to a parity correction module 286. The LLR event memory 282 is coupled to the iterative LDPC decoder 226, which is coupled to the parity module 286.

Upon filtering by the AFIR 270, the equalized signal 272 is received by the preprocessor 284, which includes a nonlinear Viterbi (NLV) detector 285 and the SOVA 224. The equalized signal 272 is received by the NLV detector 226 that determines the most likely sequence 277 of transmitted sequence v(t), which is passed to the FIFO memory 276.

The equalized signal 272 is also received by the SOVA 224, which generates bit LLRs 296. The bit LLRs 296 are provided to the bit LLR memory 278 and to the LLR event memory 282. The SOVA detector 224 determines LLRs that correspond to hidden LDPC coded bits. The LLRs are provided by the bitwise XOR of the bits in a given RS ECC symbol, e.g., the first LDPC coded bit is the LLR XOR of bits $\hat{v}(o)'\ldots\hat{v}(9)'$. Performed corrections by the LDPC decoder 226 indicates that some errors exist in the detected NRZ bits. As a result, the TPC decoder 220 performs corresponding corrections. The error correction may be performed by again performing NLV functions as another iteration following the LDPC decoder 226. However, during the second or subsequent iteration of NLV functions a check is performed to assure that the NLV generated output is consistent with parity information recovered by the LDPC code.

In this embodiment, an extra NLV circuit is not included. Instead, for each RS ECC symbol, the SOVA detector 224 provides a most likely error event (in that symbol), which has an opposite parity checksum from that of the NRZ output. When the LDPC decoder 226 detects an error in a parity check value of a given symbol, the parity correction unit 286 accesses the most likely error event. Note that this error event is consistent with the corrected parity information. The most likely error event corresponds to that symbol in the LLR event memory 282. The parity correction unit 282 performs a correction. For a further description on how error events may be obtained see U.S. patent application Ser. No. 11/518,020.

In order for the SOVA detector 224 to obtain LLRs on a SPC checksum, the TPC decoder 220 achieves synchronization. The synchronization allows the SOVA detector 224 to frame the decoded data into RS ECC symbols. When a first synchronization (sync) mark is not detected and synchronization is achieved by detecting a second sync mark, the SOVA detector 224 is able to provide symbol LLR information corresponding to data between the first and second sync marks (i.e. data1 portion).

This is unlike traditional synchronization techniques, which are unable to obtain symbol LLR information when a first sync mark is not detected. In that case, an alternative technique for generating symbol LLRs, as well as a most likely error event (in each symbol) is needed. The most likely error event corresponds to alternative values of symbol parity checksum for a first data portion of a sector is needed.

In one embodiment, the preprocessor 274 may include parallel processors to determine the maximum likelihood (ML) decoding odd-parity error events or the closest codeword c to receive a vector $\bar{v}$ for each of the possible framing phases/boundaries of a received symbol. When a received symbol has ten (10) bits it has ten possible framing phases/boundaries. A buffer size associated with the ML decoding may be determined by the length of a $data_1$ series. Once the framing signal is available based on the second sync mark, the information corresponding to one of ten possible phases is selected and used by the TPC decoder 220. This minimizes or eliminates performance loss due to a missed first sync mark.

Alternatively, in another embodiment, the parity checksum LLRs corresponding to a $data_1$ portion of a sector are recovered from bit-wise LLRs via the post-processor 284. When the first sync mark is lost, the postprocessor 284 may determine the most likely error event, the next most-likely error event, and symbol LLRs, which are designated as a combined signal 300. The combined signal 300 is provided to the LLR event memory 282. The postprocessor 284 evaluates the symbol LLRs and any determined error events. An error event refers to an error bit in a received data stream. In a first example embodiment, the postprocessor 284 determines a symbol LLR based on the XOR of a symbol or sign parameter, such as a 10-bit symbol of the estimates 294. The sign parameter is provided by equation 16.

$$\text{sign}=\Sigma x_k \bmod 2 \quad (16)$$

The symbol LLR may be set equal to the sign parameter multiplied by a minimum bit LLR. The minimum bit LLR refers to the minimum bit LLR of a line of bit LLRs. An event parameter is used and is indicative of the location of the minimum bit LLR location, in which a bit correction is made.

In a second example embodiment, a symbol LLR is also set equal to the sign parameter multiplied by a minimum bit LLR. However, the event parameter location is set to a negative one (−1), which indicates that a bit correction is not to be performed. In a third example embodiment, the symbol LLR is set equal to the sign parameter multiplied by a LLR default value and the event parameter is set to −1. The LLR default value may be set equal to the magnitude of the symbol LLR. When the first sync mark is not lost or is obtained, normal synchronization and LLR information determining techniques may be used.

The multiplexer 280 receives the symbols estimates 294 from the preprocessor 274 and a framing recovery signal 302, and provides the resulting mutiplexed output signal 304 to the LLR event memory 282. The multiplexed output signal and the symbol LLRs are provided to the LDPC decoder 226. The LDPC decoder 226 outputs a sequence of error flags 308, which indicate the locations of erroneous RS symbols. A flag is generated when the LDPC decoder 226 detects that a bit should be flipped.

The parity correction module 286 receives an event parameter or an error event signal 306 identifying most likely error event locations in which bit errors exist. Based on the event signal 306 and the LDPC output error flag signal 308, the parity correction module 286 corrects the symbols of the NRZ outputs. The finalized output of the parity correction module 286 is the first stage output v(t)'. The LDPC decoder 226 receives the symbol LLRs and based thereon provides updated parity check-sum information corresponding to the signal v'(t).

Figure 12:
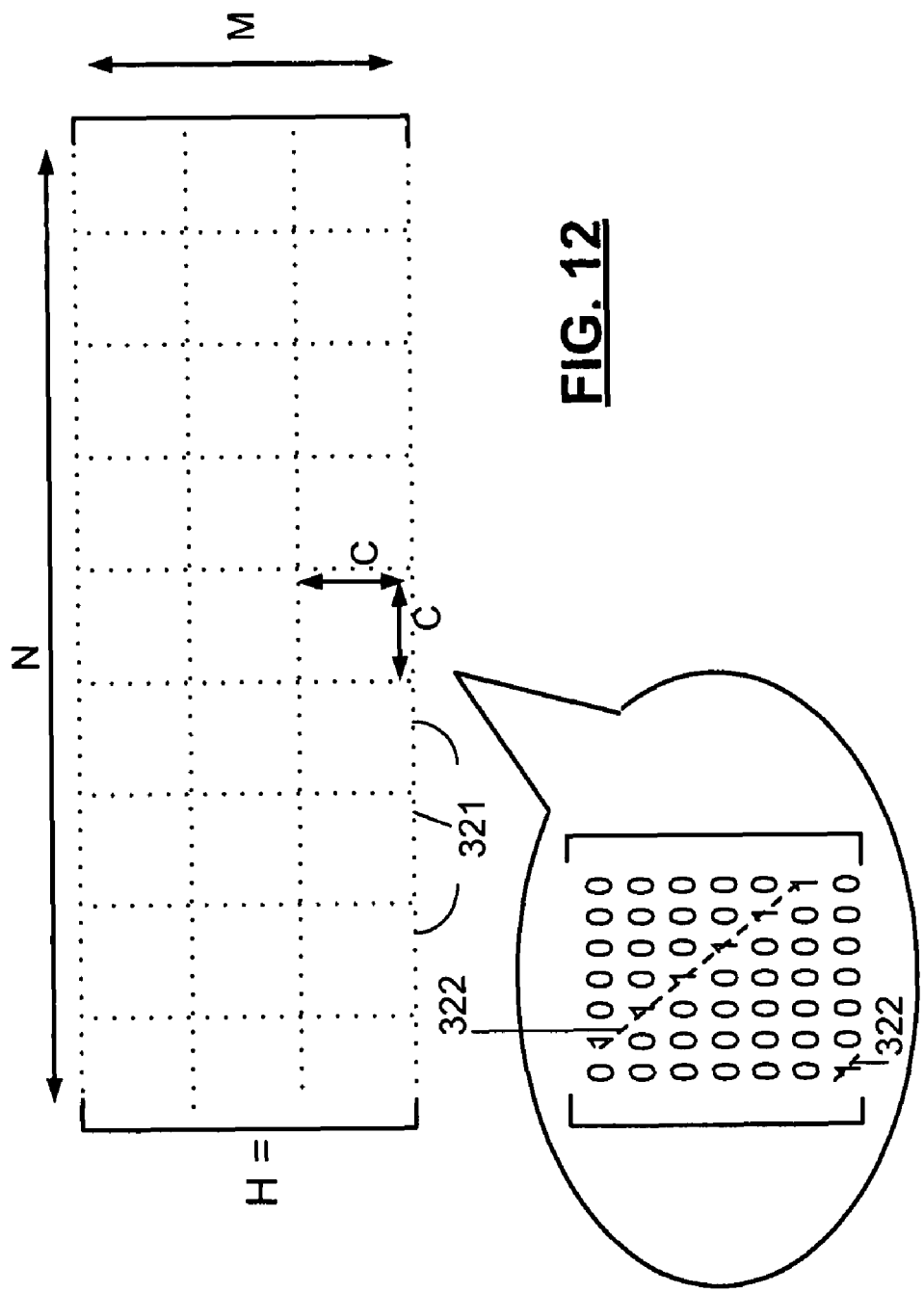
FIG. 12 is a sample parity check matrix diagram illustrating a single shift diagonal circulant according to an embodiment of the present disclosure.

The LDPC code is commonly specified via the parity check matrix H. Referring to FIG. 12, a sample parity check matrix diagram illustrating a single shift diagonal circulant 320 is shown. The parity check matrix H, as shown, is a M×N or 3C×βC matrix. Each matrix element 321 of the parity check matrix H includes a C×C matrix or circulant. The circulants as constructed include a single shift diagonal of ones. Each row of the circulants has a one, which is shifted in that row by one entry from the preceding row. The remaining entries of the circulants are zeros. The signal shift diagonal of ones is designated and/or represented by the diagonal lines 322.

Figure 13:
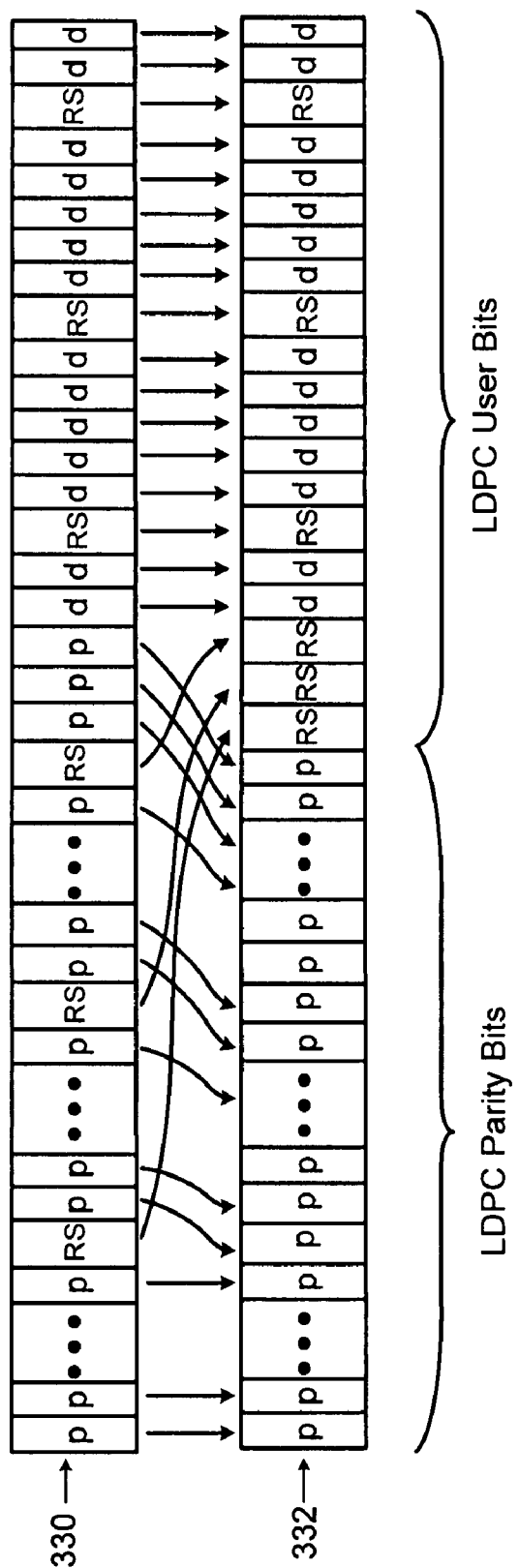
FIG. 13 is a decoder associated sector diagram according to an embodiment of the present disclosure.

Referring to FIG. 13, a decoder associated sector diagram is shown. Prior to the TPC decoder 220 generating the fifth stage output $\hat{v}(t)'$, the LDPC decoder 226 desorts an interleaved data stream, designated data stream 330. The data stream 330 has a series of LDPC parity bits followed by a series of user bits with interleaved RS parity bits throughout. The stated bits are denoted p, d and RS, respectively. The first three circulants of the data stream 330, as shown, or any predetermined number of circulants, contains the LDPC parity bits. The LDPC decoder 226 shifts the RS parity bits that are interleaved among the LDPC parity bits to create a series of RS parity bits forward of and adjacent the series of user bits. The resulting series 332 thus includes a series of solely LDPC parity bits, followed by a short series of RS parity bits, and finally followed by a series of user bits that has interleaved RS parity bits. The LDPC parity bit series is treated as such. The series of RS parity bits and the series of user bits are treated equally as LDPC user bits for decoding purposes. The LDPC decoder 226 receives a signal or accesses a memory location, such as a register, that indicates the location of the RS parity bits, as stated above. The RS parity location signal may come from an encoder, for example, in hard disk drive applications.

Figure 14:
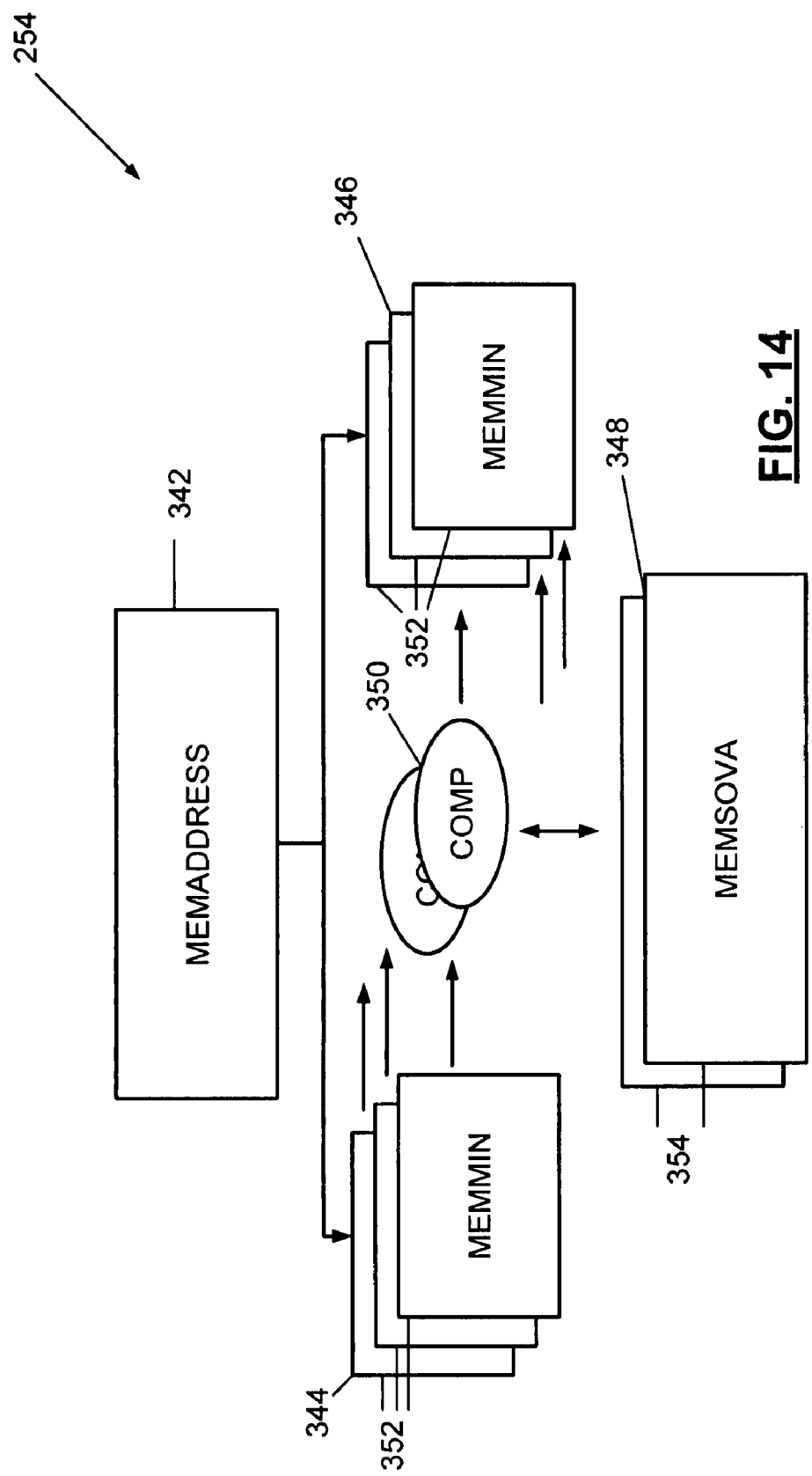
FIG. 14 is a decoder memory architecture according to an embodiment of the present disclosure.

Referring to FIG. 14, a decoder memory system architecture 340 is shown. The decoder memory architecture 254 may be associated with the LDPC decoder 226 and the tasks performed therein. The decoder memory architecture 254 includes four memories. The first memory 342 is referred to as MEMADDRESS. The second and third memories 344, 346 are specifically referred to as MEMMIN1 and MEMMIN2 and generally referred to as MEMMIN. The fourth memory 348 is referred to as MEMSOVA. MEMADDRESS is coupled to MEMMIN1 and MEMMIN2. Multiple computation and logic circuits 350 are coupled between MEMMIN1 and MEMMIN2 and are coupled to the MEMSOVA. Of course, the logic circuits 350 may be in the form of or part of a control module.

MEMADDRESS stores the parity check matrix H. Each of the MEMMIN1 and MEMMIN2 have associated instances or designated/segregated portions that correspond to the number of rows of the parity check matrix H. In the example embodiment shown, MEMMIN1 and MEMMIN2 each have three instances 352. Each instance 352 is associated with one of the three rows of the parity check matrix H. MEMMIN1 is used for a current decoding iteration. MEMMIN2 is used for a previous decoding iteration. MEMSOVA stores the LLRs received from SOVA and the corresponding sign bits. MEMSOVA, as shown, has two instances 354. The stated memories 342-348 may be of various sizes and types. As an example, MEMADDRESS may be static read only memory (SROM), the MEMMIN1 and MEMMIN2 may be read access memory (RAM) and MEMSOVA may be static read access memory (SRAM).

Referring to FIGS. 15 and 16, a sample parity check matrix memory entry configuration and a sample parity check matrix H that identifies diagonal shifting within circulants thereof are shown. The MEMADDRESS, for the example shown, has an eight bit index 360, which stores the first row of the parity check matrix H. The parity check matrix H is stored as a series of offset values, which indicate the row index or the non-zero entry along the left most column of each circulant. The parity check matrix H exhibits the property that submatrices along the same diagonal share a common offset value. Hence, only the first column and any one row of the parity check matrix H is stored. This saves memory space. The remaining parity check matrix entries can be derived based on the stated construction. The example construction of the parity check matrix H is shown where each subsequent row has the same entries as the preceding row except that they are shifted horizontally.

Referring to FIG. 17, a sample of a memory entry configuration for an iteration of LDPC decoder processing is shown. Each word row in MEMMIN holds four MEMMIN entries 366. When a 64-bit wide memory is used, each row may have four 16-bit MEMMIN entries 366. Each MEMMIN entry 366 has a first minimum value Min1, a second minimum value Min2, a parity bit sgn, an index value indx and a $2^{nd}$ parity bit. For the same example, the entries include five bits for each of the minimum values Min1, Min2, one bit for each of the $1^{st}$ and $2^{nd}$ parity bits sgn, HD, and four bits for the index value indx. This use of the MEMIN memory takes advantage of the sequential nature of memory access and allows the LDPC decoder 226 to be clocked at ¼ the effective throughput rate. The ¼ rate is due to the simultaneous processing of four data points associated with each of the four MEMMIN entries.

The minimum values Min1, Min2 refer to minimum LLR values associated with bit-to-check messaging. The $1^{st}$ parity bit sgn refers to the result of the accumulated XOR of sign of the bit messages that are passed to a check node. The $2^{nd}$ parity but HD refers to the accumulated XOR of the hard decisions associated with each adjacent bit node. The hard decision of each bit as is given by the sign of the sum of the messages passed to the bit node and the input LLR. A $2^{nd}$ bit HD with zero (0) value indicates that a parity check constraint has been satisfied. For a further description of a bipartite graph see description with respect to bit-to-check messaging below and provided references.

Referring to FIG. 19, a sample of four (4) MEMMIN entries per word in MEMMIN 380 is shown. In performing the iterative decoding process, for the example provided, four consecutive columns of entries within the parity check matrix H are processed simultaneously. This corresponds to one word in the memory 380. As there are three instances of MEMMIN, each processor, such as each of the processors 256 of FIG. 6, receives entries associated with one column and three rows of the parity check matrix H, simultaneously. This allows for simultaneous processing of four (4) consecutive rows of the parity check matrix H.

When a circulant C is not divisible by four, the last word in MEMMIN contains blanks, such as blanks C-1 and C-2, associated with the remainder of non-filled memory entries. This introduces "bubbles" in the associate pipeline of entries in MEMMIN. Although bubbles may occur, the overhead associated therewith is minimal. For example, in a circulant that has a size of eighty (80) with two blanks, the overhead is approximately ¹⁄₄₀ cycles.

Puncture & Truncation

Referring to FIG. 20, a sample parity check matrix H' illustrating a region of puncture 390 is shown. Traditionally, the term "puncture" is used in the context of using a convolution encoder and the subsequent discarding of parity bits on a regular basis. The puncture embodiment described herein is different in that it allows for the code used by an encoder and decoder to be described with respect to how puncture is performed. This allows for an adjustment in the effective code rate.

The puncture region 390 is defined in which the bits in that region are discarded. One or more columns of the parity check matrix H' are associated with the puncture region 390. The puncture length, or number of columns of the puncture region 390, is greater than or equal to 0 and less than or equal to the number of parity bits M in the parity check matrix H'. In one embodiment, the puncture length is divisible by the number of bits per RS ECC symbol. This is coupled with the restriction that full iterative redundancy is a multiple of RS ECC symbol length, which assures that insertion of iterative parity does not introduce a partial RS ECC symbol. An increase in the puncture length increases the effective code rate.

Referring to FIG. 18, a sample LLR memory entry configuration is shown. The sample LLR memory entry 370 is an example of a MEMSOVA memory word entry. From the same example, word in MEMSOVA also holds four entries. Each entry 370 includes an LLR and sign bits that are concatenated and associated therewith. In the example provided, a six bit LLR is followed by three sign bits. The sign bits are associated with bit-to-check messages, which have an identical memory access pattern to the LLR. The MEMSOVA also takes advantage of the sequential nature of memory access and allows the LDPC decoder 226 to be clocked at ¼ the effective throughput rate.

The bit-to-check messages refer to the messages of a message passing algorithm. In a message passing algorithm a bipartite graph is used to represent bit nodes and check nodes. Messages are passed between the bit nodes and the check nodes and along the graph, such that the decisions that occur at each node affect adjacent nodes. The check nodes process the bit LLRs from multiple bit nodes and determine the two LLR values with the lowest absolute values Min1, Min2. For more information regarding message passing algorithms see U.S. Pat. No. 7,184,486, entitled "LDPC Encoder and Decoder and Method Thereof", filed Dec. 7, 2000, which is incorporated in its entirety by reference herein.

For example, an associated $data_1$/$data_2$ series with 10-bit symbols has a puncture length that is divisible by 10. The puncture count begins from the right of the $3^{rd}$ circulant 392 and progresses toward the left. The puncture count may be determined via the puncture bit counter 219. Zero LLRs are prewritten to the puncture locations in MEMSOVA 354. A SOVA expects an output of one valid LLR per every symbol or 10 cycles, due to the 10-bit symbol length. As such, the zeros are written to the locations corresponding to the $3^{rd}$ circulant during the other 9 cycles. For this reason, the decoding procedure is unchanged from an unpunctured system. On the encoding end correct bits are encoded while other bits that are not needed for transmission are discarded. For this reason, the encoding process is virtually unchanged.

Referring to FIGS. 6 and 21, in FIG. 21 a sample parity check matrix H" illustrating a region of truncation 400 is shown. Truncation allows the user to vary the length of a sector by replacing part of a codeword with 0s. The truncation length is greater than or equal to 0 and less than or equal to ($\beta$-M/C-1)*C, such as for example ($\beta$-4)*C, where again $\beta$ is the number of parity check matrix columns. The numeral "4" represents the number of circulants that are not truncated. The number of non-truncated circulants may vary per application and thus have some other predetermined amount. The three leftmost circulant columns 402 and the rightmost circulant column 404 are not truncated. The truncated bit counts start from the left of the $4^{th}$ circulant 406 and progresses towards the right. The truncated bit count may be determined via the truncation bit counter 221. The first and last columns of the parity check matrix H" are not altered by puncture or truncation to prevent alteration of the $2^{nd}$ parity bits HD described herein. When the truncation length is greater than zero, contents of the LDPC encoder ROM 200 are cycled via the shift register chain 204 before asserting that the LDPC encoder 190 is ready.

A priori information is known for puncture, as well as for truncation. Puncture length and location is known by the LDPC encoder 190 and may be stored and provided to or accessible by the LDPC decoder 226. The puncture length and thus the effective code rate may be dynamically adjusted based on the application. As well, length and location of truncation is also known by the LDPC encoder 190 and is provided to or accessible by the LDPC decoder 226. The LDPC encoder 190 skips data based on the known truncation region 400.

Read Before Write

Figure 22:
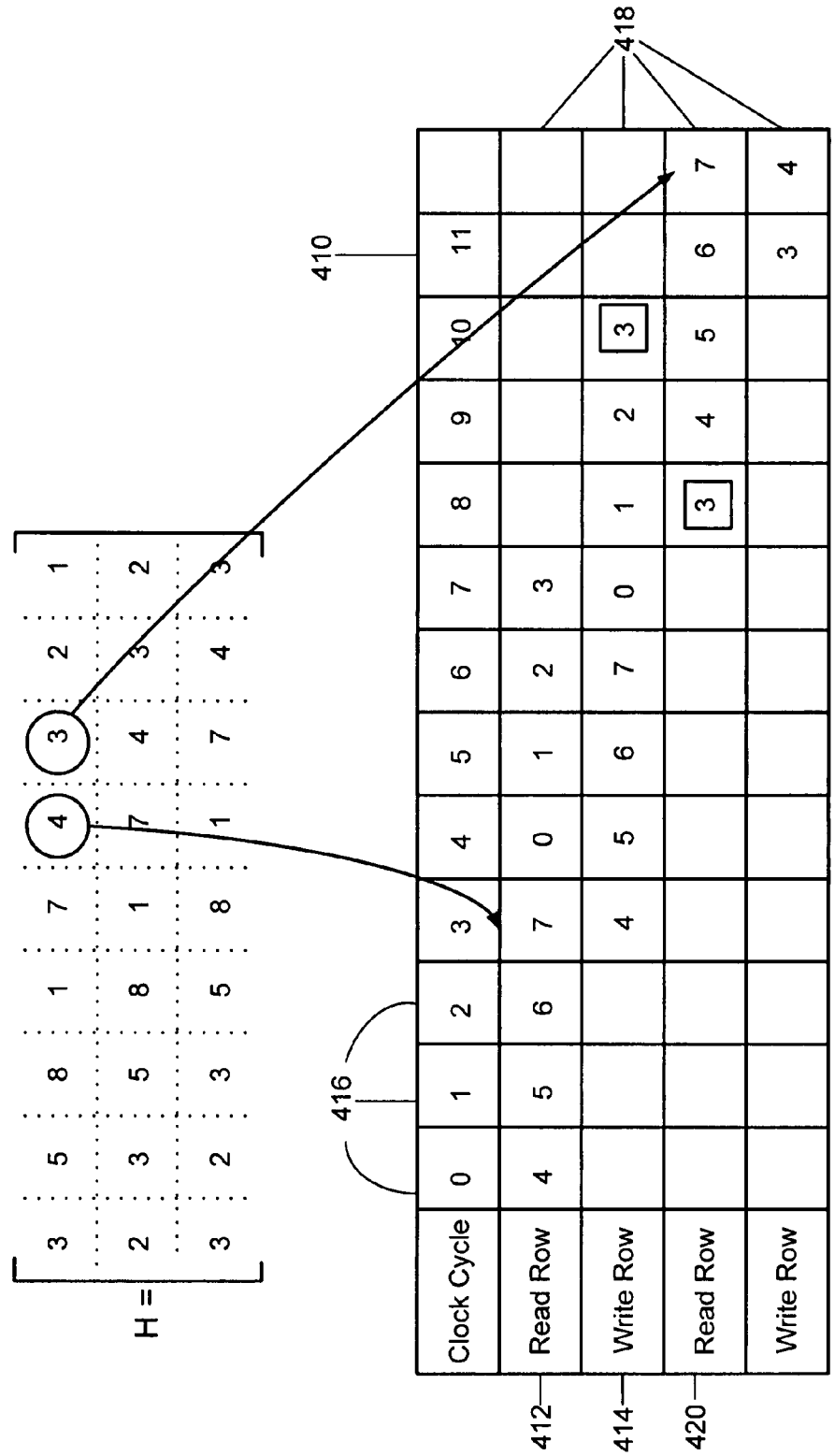
FIG. 22 is a timing diagram illustrating a read before write violation based on a parity check matrix according to an embodiment of the present disclosure.

Referring to FIG. 22, a timing diagram illustrating a read before write (RBW) implementation based on the parity check matrix H or $H_{orig}$ is shown. The embodiment of FIG. 22 is based on the processing pipeline of three cycles. The RBW problem occurs when one is attempting to read from a memory location in a MEMMIN memory prior to data entry being written in that location. In the example embodiment, where a parity check matrix $H_{orig}$ is a 3C×8C matrix. The RBW problem is possible when $-3 \leq X \leq 0$ where the circulant difference value X is the difference in shift values between adjacent circulants of a single row of the parity check matrix $H_{orig}$. The circulant numbers in the parity check matrix H indicate the shift in that associated circulant. For example, the top left corner circulant of the parity check matrix $H_{orig}$ or the circulant associated with the $1^{st}$ row and the $1^{st}$ column, has a 3. The 3 indicates that there is a 1 in the third column of the $1^{st}$ row of that circulant.

In the timing chart 410 the first read row 412 that is shown corresponds to the circulant having entry 4. Thus, the read row 412 starts with 4 and ends with 3, since there are eight entries per row. A write row 414 is shifted in time by three due to the number of cycles. The relative clock cycles 416 are shown in relation to the read and write entries 418. The second read row 420 starts with 3, since that is the next entry in the parity check matrix $H_{orig}$. Note that the processor, such as a processor of the receive channel processing circuit 220, is attempting to read from MEMMIN with respect to the entry 3 before information is written by the previous write row, which can cause an error. As such, incorrect data can be read.

Three example embodiments are provided below that prevent the RBW problem. Note that various other techniques may be derived from the example embodiments provided. Referring to FIG. 23, a parity check matrix diagram illustrating incrementation of a matrix column 430 according to a first embodiment is shown. The column of circulant entries 430 associated with the second circulant entry 432 is rotated by the value of that circulant. The circulant values in the $7^{th}$ circulant column of the parity check matrix $H_{orig}$ are increased by the value of the circulant in the first row of that column, specifically 3 for the provided example. The result is shown by the new parity check matrix $H_{new}$.

In a second embodiment, the columns of the parity check matrix $H_{orig}$ that are of concern are swapped, such as columns 6 and 7. This permutates the circulants corresponding to the LDPC user bits. In a third embodiment, the RBW constraint is applied during the search for code. In the third embodiment the code is altered, as opposed to in the stated first and second embodiments.

Early Termination

Referring again to FIG. 17, early stopping of iterative decoding may be based on the HD bit of MEMMIN. When each hard decision bit of each MEMMIN word is equal to 0, the parity check constraint is satisfied and a valid codeword is detected. During each round of decoding, the HD bit is read after the columns of the parity check matrix H have been processed. The HD bit may be read during decoding of either the last column of circulants in a current iteration or the first column of circulants in a subsequent iteration.

Referring to FIGS. 24 and 25, a decoding iteration diagram illustrating early termination and a parity check matrix diagram illustrating a last circulant block column is shown. A series of decoder iterations 440 and a sample parity check matrix H''' are shown. The parity check matrix H''' has a last column block 442. At the end of each decoding iteration the HD bits are read, as shown by timing blocks 444. The LDPC decoder 226 determines whether to stop iterative decoding based on the HD bits. The code design ensures that each row in the parity check matrix H''' has one non-zero entry in each circulant. In one embodiment, each row in the parity check matrix H''' has only one non-zero entry. As processing enters the last and final circulant block 442, the HD bit for the check nodes adjacent to a processed bit node becomes valid. There is no overhead in the memory access associated with early termination.

Figure 26:
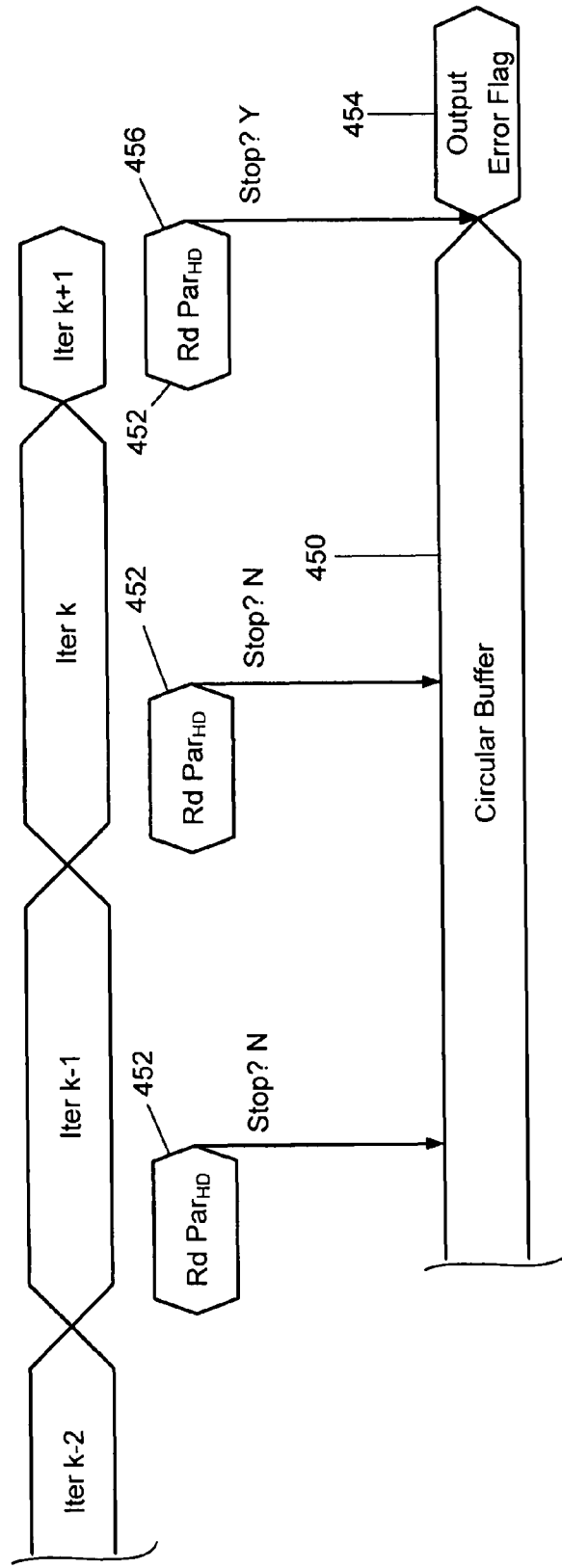
FIG. 26 is a early termination sequence diagram according to an embodiment of the present disclosure.
Figure 27:
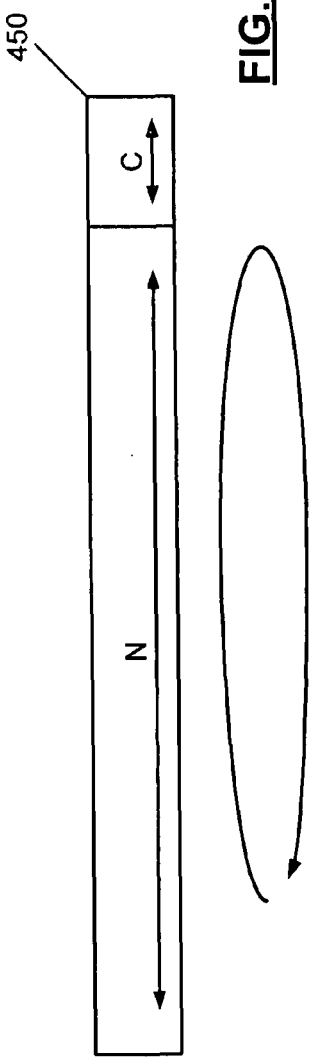
FIG. 27 is a circular buffer diagram according to an embodiment of the present disclosure.

Referring to FIG. 26, an early termination sequence diagram is shown. A sequence of decoding iterations . . . k−1, k, k+1 . . . is shown, as well as the reading of the error flag bits and the beginning of each iteration. The error flag bits are cached in a circular buffer 450, as shown by timing blocks 452. The length of the circular buffer 450 is shown in FIG. 27. The circular buffer 450 has a length that is equal to the number of parity check matrix H columns N plus the maximum circulant length C. The error flag bits of a previous iteration is overwritten by a current error flag bit. The error flag output bit 454 is updated laterally across the corresponding bipartite graph. An example of when the error flag output bit 454 indicates that the parity check constraint is met is shown. A yes (Y) output of the HD reading 456 associated with the iteration k+1 is such an indication. When the parity check constraint is satisfied, an address pointer, which is used to indicate a current position in the circular buffer 450, is returned to the start of a last sector of the circular buffer 450. Upon constraint satisfaction, the error flag bit 454 is outputted.

Power Consumption and Self Test

To conserve on power consumption, decoding is enabled when needed. Referring again to FIG. 6, to verify that the encoding and decoding system are functioning properly, the LDPC encoder 190 may be used in the decoder path 156 to perform encoding as LDPC user bits are received. This may is referred to as a built in self-test (BIST). Several BIST examples are described below. The decoded bits or first decoder output signal may be inputted into the LDPC encoder 190. A second decoder output signal of the LDPC decoder 226, generated as a result of the stated input, may be compared with the first decoder output signal. When an error is not detected or a current decoding status is a valid codeword than decoding is ceased. As an alternative, the encoded result may be compared with that received. When the encoded result is the same as that received through the channel than decoding is not performed or needed. As another alternative, LDPC parity bits generated at the encoder may be compared with that generated at the LDPC decoder. Decoding may be aborted when the LDPC parity bits are the same. As yet another alternative, a comparison in parallel is performed with column processing of the three left most columns of circulants of the parity check matrix. There is no overhead associated with memory access for this alternative.

Missed Synchronization Mark

Sync marks are often used and placed in a transmission signal for receiver timing synchronization purposes. The sync marks typically consist of a known series of data or 0s and/or 1s. When there is more than one sync mark inserted into the data (e.g. two sync marks), the synchronization can be achieved by detecting either the first or the second sync mark. When the first sync mark is missed, due to channel noise and other interference, and the second sync mark is detected, then the data between the first and second sync marks is typically lost and can be recovered with the aid of outer RS ECC decoder. The embodiments of FIGS. 28 and 29 provide methods of recovering the data between sync marks via an iterative decoder.

Figure 28:
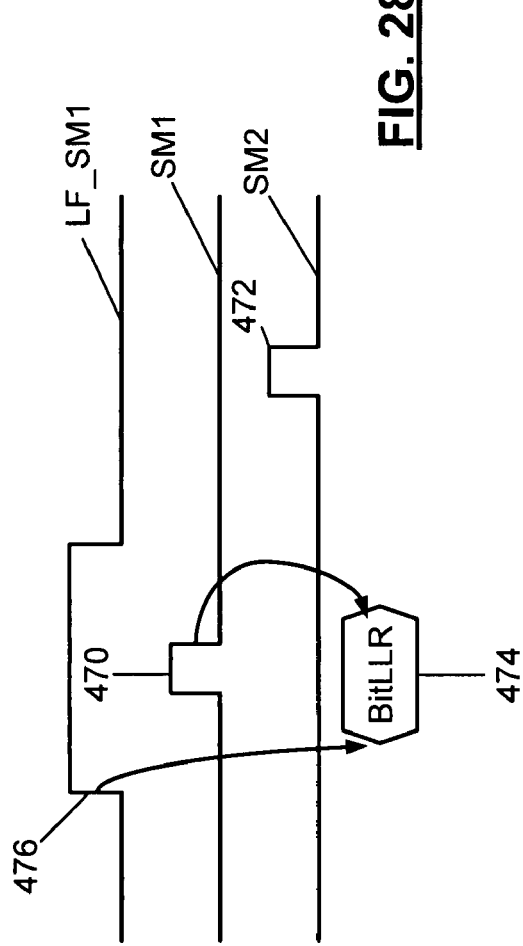
FIG. 28 is a synchronization timing diagram illustrating detection of multiple synchronization marks.

Referring to FIG. 28, a synchronization timing diagram illustrating detection of multiple synchronization marks is shown. A look-for-sync-mark signal LF_SM1, a first sync mark signal SM1 and a second sync mark signal SM2 are shown. A first sync mark pulse 470 and a second sync mark pulse 472 are shown for each of the sync mark signals SM1, SM2. The sync mark signals SM1, SM2 are monitored and bit LLRs, such as the bit LLRs described above, are cached in a buffer 474 at the rising edge 476 of the LF_SM1 signal. Bit LLRs are also cached between the sync mark pulses 470, 472. The alignment of the data is calculated once the second sync mark pulse 472 is detected.

Figure 29:
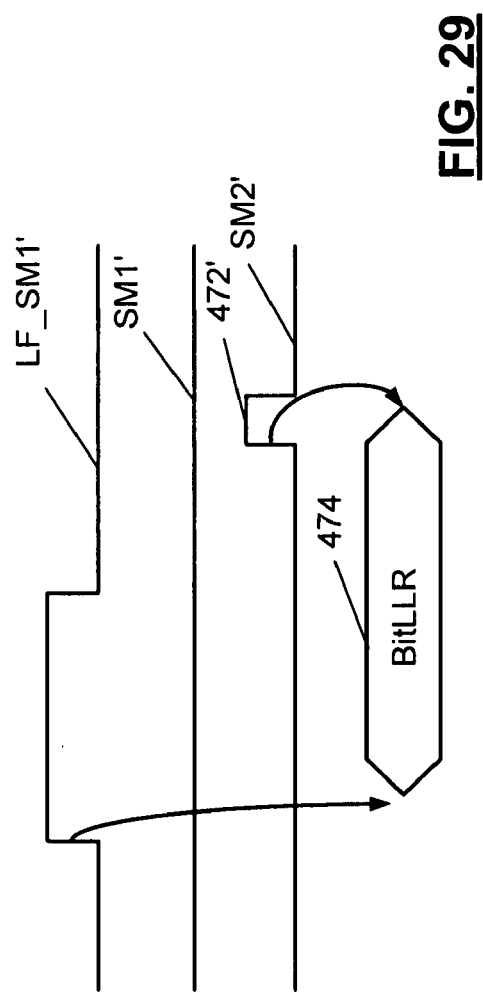
FIG. 29 is a synchronization timing diagram illustrating missed detection of a synchronization mark.

Referring to FIG. 29, a synchronization timing diagram illustrating missed detection of a synchronization mark is shown. Similar to the embodiment of FIG. 28, the bit LLRs are cached in the buffer 474 at the rising edge of the LF_SM1' signal. Note that a first sync mark pulse is not detected and thus is not shown on the first sync mark signal SM1'. When a second sync mark pulse 472' is detected the LDPC decoder 226 or processor thereof, which has knowledge of the distance between sync marks, accesses the cached bits for the stated distance preceding the second sync mark pulse 472'. Thus, the information between the sync marks is not lost. The alignment of the data is calculated once the second sync mark pulse 472' is detected. Delay in processing due to the accessing of cached data is hidden within the latency of the total decoding (2 sector) process. One example application in which the missed sync mark recovery techniques described herein may be used is a hard disk drive application.

In the event of missed first sync mark, the symbol-LLR for symbols between sync mark pulses are not available from the SOVA detector 224. The SOVA detector 224 is unable to start producing symbol LLRs prior to achieving synchronization, i.e. without knowledge of symbol boundaries. However, the SOVA detector 224 is able to produce bit-wise LLRs without obtaining synchronization. Bit-wise LLRs can be used to recover symbol-wise LLRs. The recovery procedure is based on knowledge that a single bit error is a dominant error event for a magnetic recording channel. Therefore, good approximation to symbol LLRs may be derived by assuming that bit LLRs at each location are obtained by considering paths corresponding to a single bit error at that location. More specifically, the absolute value of a symbol LLR is approximated by taking the minimum of absolute values of bit LLRs in a corresponding parity symbol. The sign of the LLR is set based on the XOR of hard decisions of bits in that symbol.

Besides computing symbol LLRs, the SOVA detector 224 also produces a location and an error mask that corresponds to a most likely error event violating a SPC constraint in a given symbol. Consistent with the assumption of single bit error events, the location of such error event corresponds to a bit that has a smallest LLR of an absolute value of that symbol. With a dual-bit SOVA architecture, two 6 bit LLRs are produced per cycle. The missed sync mark processor stores the minimum of the two 6 bit LLR values and a select bit, which is needed by the parity correction module 286 to indicate the ML error location.

The above-described embodiments may be applied in various communication applications, including wireless communication and communication with a storage medium. The applications may satisfy and follow any of the IEEE standards 802.11, 802.11a, 802.11b, 802.11g, 802.11h, 802.11n, 802.16, and 802.20, as well as Bluetooth protocols. The embodiments may be applied in coding for digital audio and video broadcasting, as well as in coding for wireless networks, local area networks, wi-Fi networks, and other communication networks.

Referring now to FIGS. 30A-30G, various exemplary implementations incorporating the teachings of the present disclosure are shown.

Figure 30A:
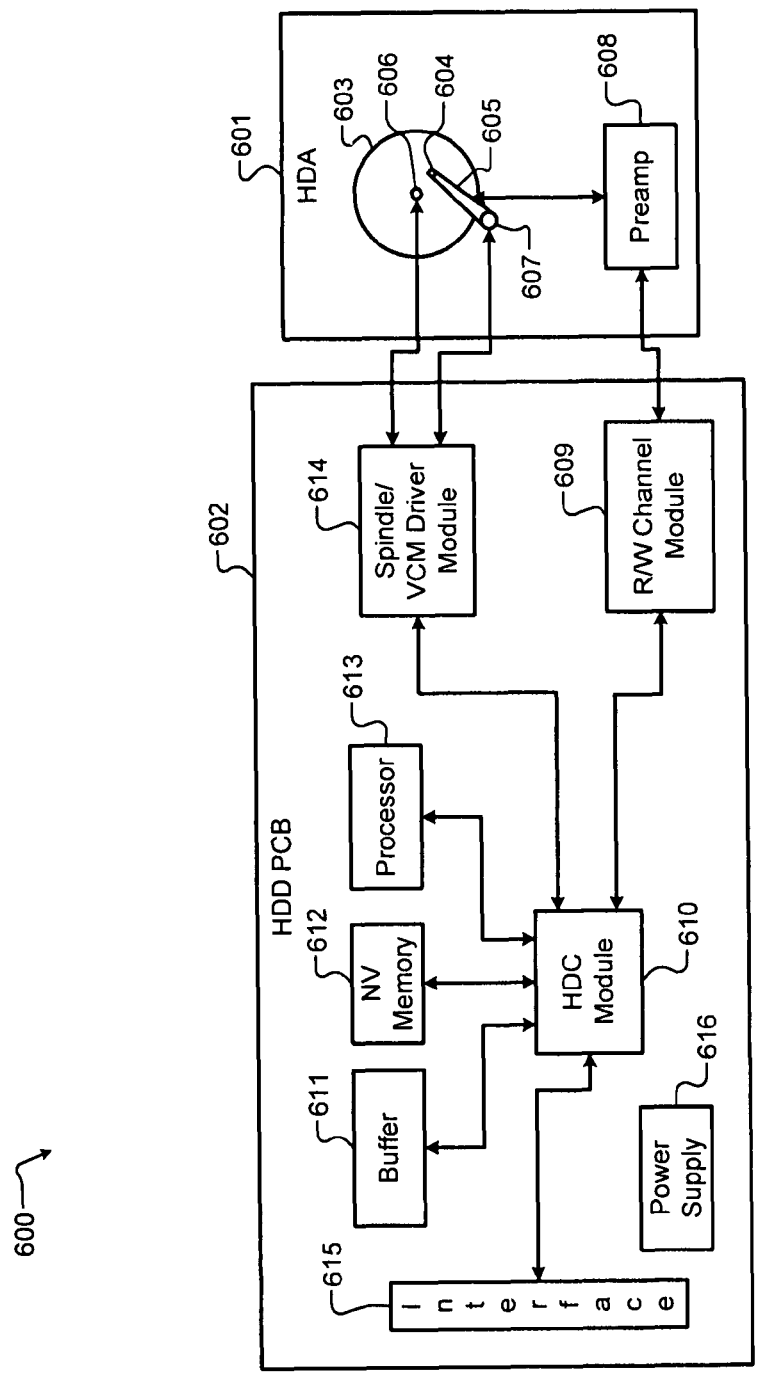
FIG. 30A is a functional block diagram of a hard disk drive.

Referring now to FIG. 30A, the teachings of the disclosure can be implemented in a R/W channel module 609 of a hard disk drive (HDD) 600. The above-stated techniques may be used in read from and writing to a magnetic storage medium 603. The HDD 600 includes a hard disk assembly (HDA) 601 and a HDD PCB 602. The HDA 601 may include the magnetic medium 603, such as one or more platters that store data, and a read/write device 604. The read/write device 604 may be arranged on an actuator arm 605 and may read and write data on the magnetic medium 603. Additionally, the HDA 601 includes a spindle motor 606 that rotates the magnetic medium 603 and a voice-coil motor (VCM) 607 that actuates the actuator arm 605. A preamplifier device 608 amplifies signals generated by the read/write device 604 during read operations and provides signals to the read/write device 604 during write operations.

The HDD PCB 602 includes the read/write channel module (hereinafter, "read channel") 609, a hard disk controller (HDC) module 610, a buffer 611, nonvolatile memory 612, a processor 613, and a spindle/VCM driver module 614. The read channel 609 processes data received from and transmitted to the preamplifier device 608. The HDC module 610 controls components of the HDA 601 and communicates with an external device (not shown) via an I/O interface 615. The external device may include a computer, a multimedia device, a mobile computing device, etc. The I/O interface 615 may include wireline and/or wireless communication links.

The HDC module 610 may receive data from the HDA 601, the read channel 609, the buffer 611, nonvolatile memory 612, the processor 613, the spindle/VCM driver module 614, and/or the I/O interface 615. The processor 613 may process the data, including encoding, decoding, filtering, and/or formatting. The processed data may be output to the HDA 601, the read channel 609, the buffer 611, nonvolatile memory 612, the processor 613, the spindle/VCM driver module 614, and/or the I/O interface 615.

The HDC module 610 may use the buffer 611 and/or nonvolatile memory 612 to store data related to the control and operation of the HDD 600. The buffer 611 may include DRAM, SDRAM, etc. The nonvolatile memory 612 may include flash memory (including NAND and NOR flash memory), phase change memory, magnetic RAM, or multi-state memory, in which each memory cell has more than two states. The spindle/VCM driver module 614 controls the spindle motor 606 and the VCM 607. The HDD PCB 602 includes a power supply 616 that provides power to the components of the HDD 600.

Figure 30B:
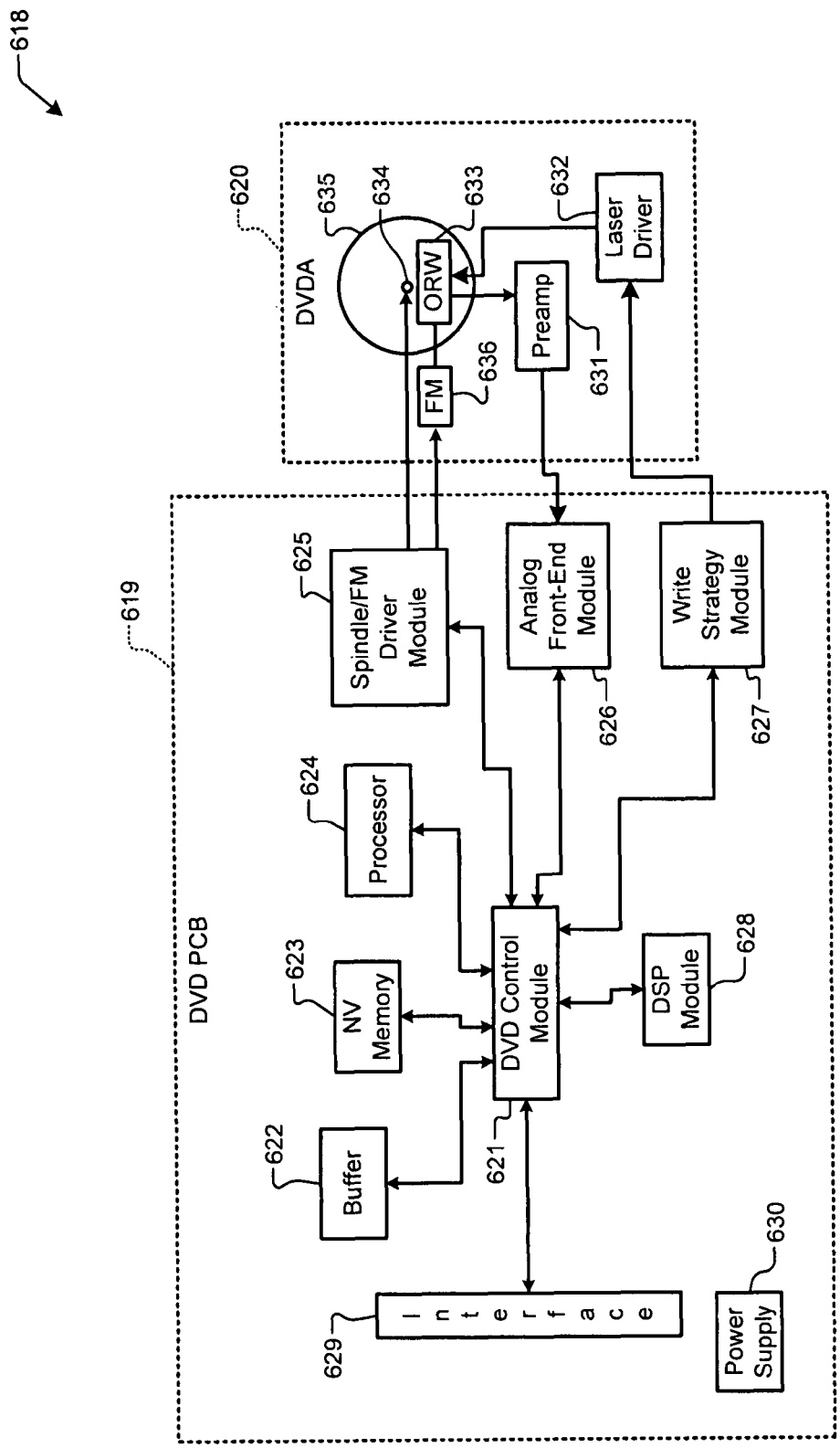
FIG. 30B is a functional block diagram of a DVD drive.

Referring now to FIG. 30B, the teachings of the disclosure can be similarly implemented in an analog front-end module 626 and a write strategy module 627 of a DVD drive 618 or of a CD drive (not shown). The DVD drive 618 includes a DVD PCB 619 and a DVD assembly (DVDA) 620. The DVD PCB 619 includes a DVD control module 621, a buffer 622, nonvolatile memory 623, a processor 624, a spindle/FM (feed motor) driver module 625, the analog front-end module 626, the write strategy module 627, and a DSP module 628.

The DVD control module 621 controls components of the DVDA 620 and communicates with an external device (not shown) via an I/O interface 629. The external device may include a computer, a multimedia device, a mobile computing device, etc. The I/O interface 629 may include wireline and/or wireless communication links.

The DVD control module 621 may receive data from the buffer 622, nonvolatile memory 623, the processor 624, the spindle/FM driver module 625, the analog front-end module 626, the write strategy module 627, the DSP module 628, and/or the I/O interface 629. The processor 624 may process the data, including encoding, decoding, filtering, and/or formatting. The DSP module 628 performs signal processing, such as video and/or audio coding/decoding. The processed data may be output to the buffer 622, nonvolatile memory 623, the processor 624, the spindle/FM driver module 625, the analog front-end module 626, the write strategy module 627, the DSP module 628, and/or the I/O interface 629.

The DVD control module 621 may use the buffer 622 and/or nonvolatile memory 623 to store data related to the control and operation of the DVD drive 618. The buffer 622 may include DRAM, SDRAM, etc. The nonvolatile memory 623 may include flash memory (including NAND and NOR flash memory), phase change memory, magnetic RAM, or multi-state memory, in which each memory cell has more than two states. The DVD PCB 619 includes a power supply 630 that provides power to the components of the DVD drive 618.

The DVDA 620 may include a preamplifier device 631, a laser driver 632, and an optical device 633, which may be an optical read/write (ORW) device or an optical read-only (OR) device. A spindle motor 634 rotates an optical storage medium 635, and a feed motor 636 actuates the optical device 633 relative to the optical storage medium 635.

When reading data from the optical storage medium 635, the laser driver provides a read power to the optical device 633. The optical device 633 detects data from the optical storage medium 635, and transmits the data to the preamplifier device 631. The analog front-end module 626 receives data from the preamplifier device 631 and performs such functions as filtering and A/D conversion. To write to the optical storage medium 635, the write strategy module 627 transmits power level and timing information to the laser driver 632. The laser driver 632 controls the optical device 633 to write data to the optical storage medium 635.

Figure 30D:
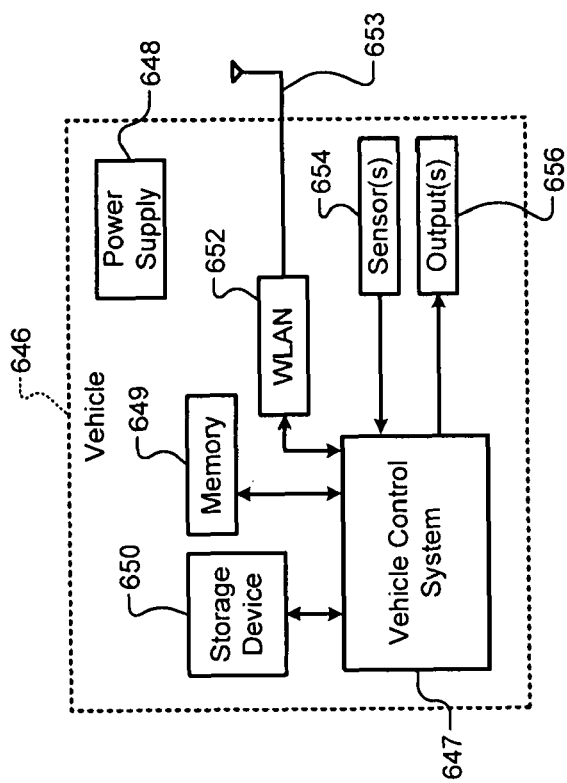
FIG. 30D is a functional block diagram of a vehicle control system.
Figure 30C:
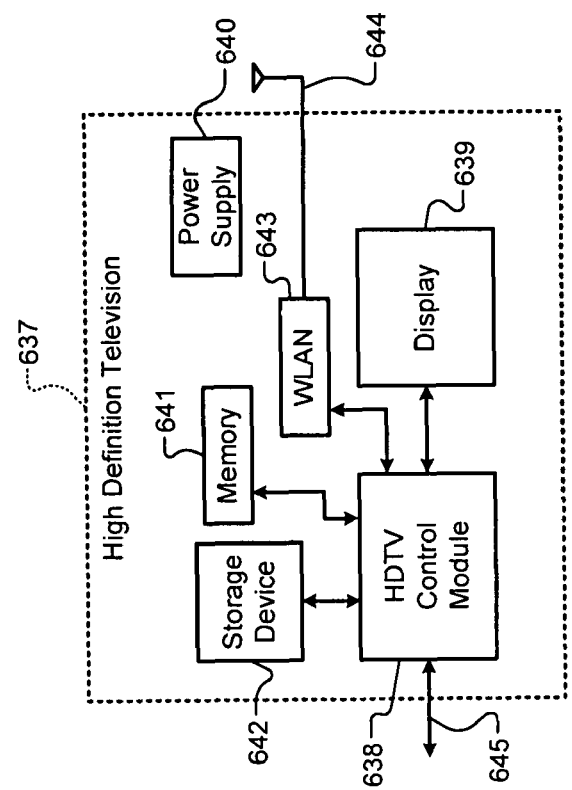
FIG. 30C is a functional block diagram of a high definition television.

Referring now to FIG. 30C, the teachings of the disclosure can be implemented in a HDTV control module 638 and/or a WLAN interface 643 of a high definition television (HDTV) 637. For example, the teachings may be used in decoding data received via an antenna 644. The HDTV 637 includes a HDTV control module 638, a display 639, a power supply 640, memory 641, a storage device 642, the WLAN interface 643 and the associated antenna 644, and an external interface 645.

The HDTV 637 can receive input signals from the WLAN interface 643 and/or the external interface 645, which sends and receives information via cable, broadband Internet, and/or satellite. The HDTV control module 638 may process the input signals, including encoding, decoding, filtering, and/or formatting, and generate output signals. The output signals may be communicated to one or more of the display 639, memory 641, the storage device 642, the WLAN interface 643, and the external interface 645.

Memory 641 may include random access memory (RAM) and/or nonvolatile memory such as flash memory, phase change memory, or multi-state memory, in which each memory cell has more than two states. The storage device 642 may include an optical storage drive, such as a DVD drive, and/or a hard disk drive (HDD). The HDTV control module 638 communicates externally via the WLAN interface 643 and/or the external interface 645. The power supply 640 provides power to the components of the HDTV 637.

Referring now to FIG. 30D, the teachings of the disclosure may be implemented in a vehicle control system 647 and/or a WLAN interface 652 of a vehicle 646. The vehicle 646 may include the vehicle control system 647, a power supply 648, memory 649, a storage device 650, and the WLAN interface 652 and associated antenna 653. The vehicle control system 647 may be a powertrain control system, a body control system, an entertainment control system, an anti-lock braking system (ABS), a navigation system, a telematics system, a lane departure system, an adaptive cruise control system, etc.

The vehicle control system 647 may communicate with one or more sensors 654 and generate one or more output signals 656. The sensors 654 may include temperature sensors, acceleration sensors, pressure sensors, rotational sensors, airflow sensors, etc. The output signals 656 may control engine operating parameters, transmission operating parameters, suspension parameters, etc.

The power supply 648 provides power to the components of the vehicle 646. The vehicle control system 647 may store data in memory 649 and/or the storage device 650. Memory 649 may include random access memory (RAM) and/or nonvolatile memory such as flash memory, phase change memory, or multi-state memory, in which each memory cell has more than two states. The storage device 650 may include an optical storage drive, such as a DVD drive, and/or a hard disk drive (HDD). The vehicle control system 647 may communicate externally using the WLAN interface 652.

Figure 30F:
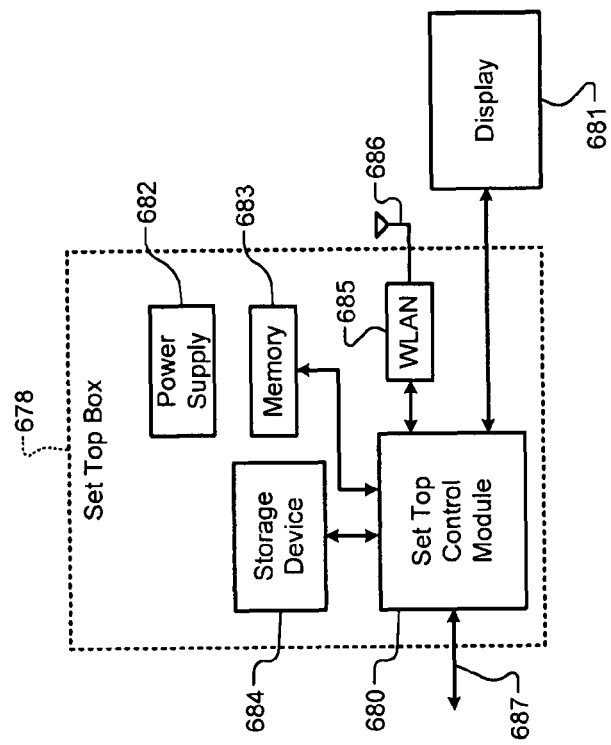
FIG. 30F is a functional block diagram of a set top box.
Figure 30E:
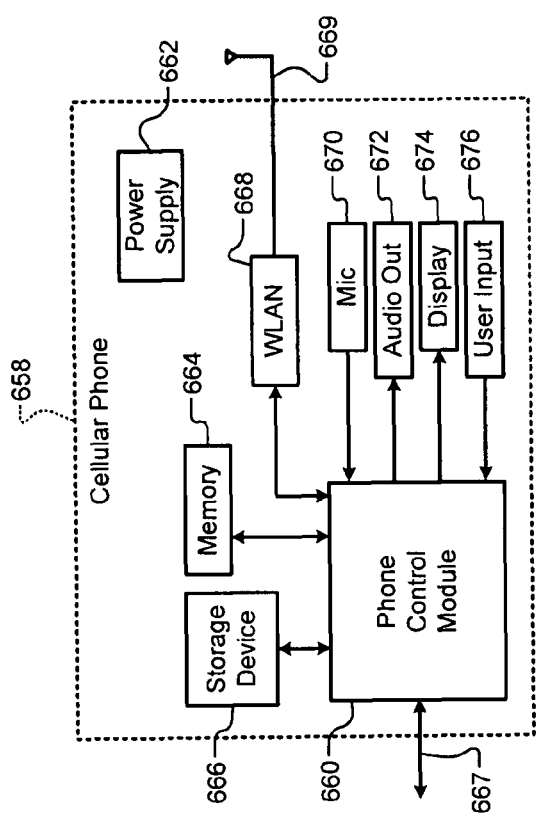
FIG. 30E is a functional block diagram of a cellular phone.

Referring now to FIG. 30E, the teachings of the disclosure can be implemented in a phone control module 660 and/or a WLAN interface 668 of a cellular phone 658. The cellular phone 658 includes the phone control module 660, a power supply 662, memory 664, a storage device 666, and a cellular network interface 667. The cellular phone 658 may include the WLAN interface 668 and associated antenna 669, a microphone 670, an audio output 672 such as a speaker and/or output jack, a display 674, and a user input device 676 such as a keypad and/or pointing device.

The phone control module 660 may receive input signals from the cellular network interface 667, the WLAN interface 668, the microphone 670, and/or the user input device 676. The phone control module 660 may process signals, including encoding, decoding, filtering, and/or formatting, and generate output signals. The output signals may be communicated to one or more of memory 664, the storage device 666, the cellular network interface 667, the WLAN interface 668, and the audio output 672.

Memory 664 may include random access memory (RAM) and/or nonvolatile memory such as flash memory, phase change memory, or multi-state memory, in which each memory cell has more than two states. The storage device 666 may include an optical storage drive, such as a DVD drive, and/or a hard disk drive (HDD). The power supply 662 provides power to the components of the cellular phone 658.

Referring now to FIG. 30F, the teachings of the disclosure can be implemented in a set top control module 680 and/or a WLAN interface 685 of a set top box 678. The set top box 678 includes the set top control module 680, a display 681, a power supply 682, memory 683, a storage device 684, and the WLAN interface 685 and associated antenna 686.

The set top control module 680 may receive input signals from the WLAN interface 685 and an external interface 687, which can send and receive information via cable, broadband Internet, and/or satellite. The set top control module 680 may process signals, including encoding, decoding, filtering, and/or formatting, and generate output signals. The output signals may include audio and/or video signals in standard and/or high definition formats. The output signals may be communicated to the WLAN interface 685 and/or to the display 681. The display 681 may include a television, a projector, and/or a monitor.

The power supply 682 provides power to the components of the set top box 678. Memory 683 may include random access memory (RAM) and/or nonvolatile memory such as flash memory, phase change memory, or multi-state memory, in which each memory cell has more than two states. The storage device 684 may include an optical storage drive, such as a DVD drive, and/or a hard disk drive (HDD).

Figure 30G:
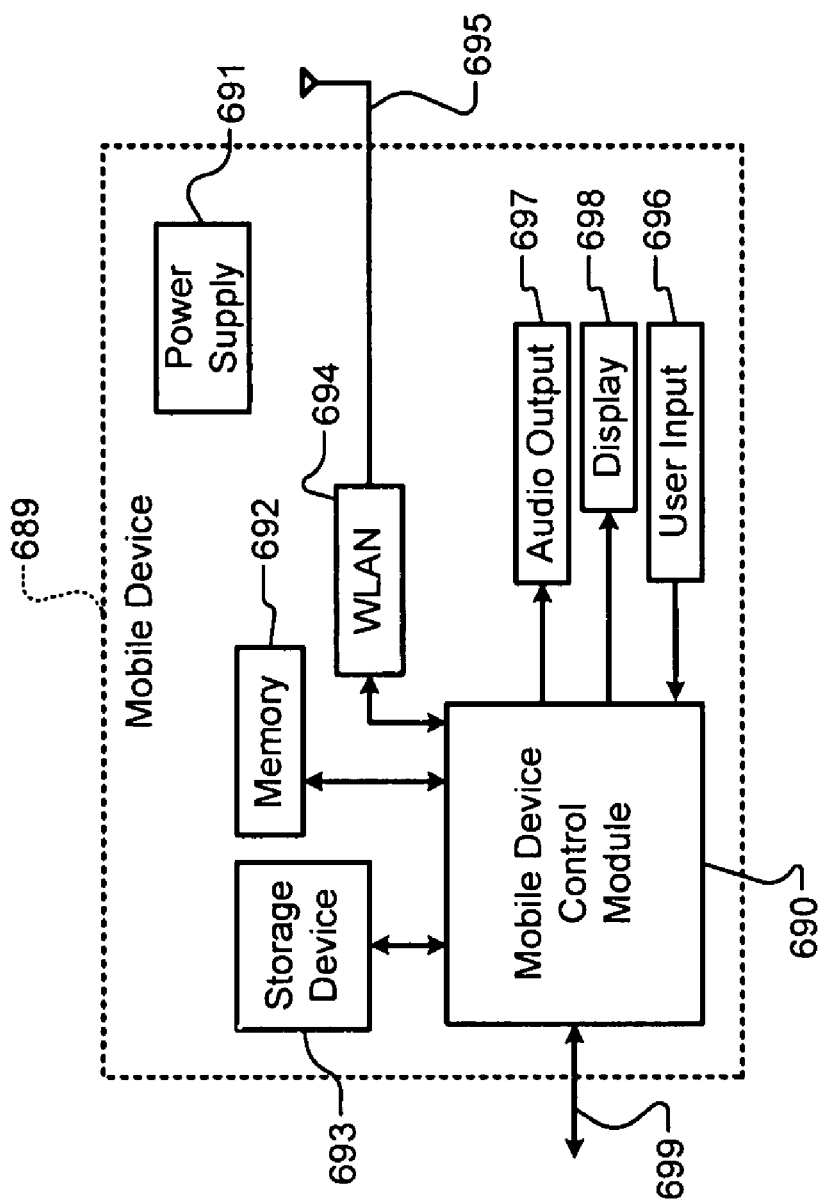
FIG. 30G is a functional block diagram of a mobile device.

Referring now to FIG. 30G, the teachings of the disclosure can be implemented in a mobile device control module 690 and/or a WLAN interface 694 of a mobile device 689. The mobile device 689 may include the mobile device control module 690, a power supply 691, memory 692, a storage device 693, the WLAN interface 694 and associated antenna 695, and an external interface 699.

The mobile device control module 690 may receive input signals from the WLAN interface 694 and/or the external interface 699. The external interface 699 may include USB, infrared, and/or Ethernet. The input signals may include compressed audio and/or video, and may be compliant with the MP3 format. Additionally, the mobile device control module 690 may receive input from a user input 696 such as a keypad, touchpad, or individual buttons. The mobile device control module 690 may process input signals, including encoding, decoding, filtering, and/or formatting, and generate output signals.

The mobile device control module 690 may output audio signals to an audio output 697 and video signals to a display 698. The audio output 697 may include a speaker and/or an output jack. The display 698 may present a graphical user interface, which may include menus, icons, etc. The power supply 691 provides power to the components of the mobile device 689. Memory 692 may include random access memory (RAM) and/or nonvolatile memory such as flash memory, phase change memory, or multi-state memory, in which each memory cell has more than two states. The storage device 693 may include an optical storage drive, such as a DVD drive, and/or a hard disk drive (HDD). The mobile device may include a personal digital assistant, a media player, a laptop computer, a gaming console or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A decoder memory system comprising:
    a first memory configured to store a parity check matrix H;
    a second memory associated with a first decoding iteration of a tensor product code, the second memory configured to receive a first portion of the parity check matrix H from the first memory;
    a third memory associated with a second decoding iteration of the tensor product code, the third memory configured to receive a second portion of the parity check matrix H from the first memory, wherein the second decoding iteration is performed subsequent to and based on the first decoding iteration, and wherein the second portion is same as the first portion;
    a fourth memory configured to store likelihood ratios; and
    a control module configured to generate a low-density parity check decoded signal based on (i) the parity check matrix H, (ii) the first decoded iteration, and (iii) the likelihood ratios.

2. The decoder memory system of claim 1, wherein:
the second memory is configured to store a plurality of segregated portions; and
each of the plurality of segregated portions is associated with a group of rows in the parity check matrix H.

3. The decoder memory system of claim 1, wherein:
the third memory is configured to store a plurality of segregated portions; and
each of the plurality of segregated portions is associated with a group of rows in the parity check matrix H.

4. The decoder memory system of claim 1, wherein the fourth memory is configured to store a plurality of segregated portions.

5. The decoder memory system of claim 1, wherein:
the second memory comprises a plurality of rows; and
each of the plurality of rows comprising a word.

6. The decoder memory system of claim 5, wherein the word comprises a plurality of sequential multi-bit entries.

7. The decoder memory system of claim 6, wherein the plurality of sequential multi-bit entries comprises a first minimum bit log-likelihood ratio.

8. The decoder memory system of claim 7, wherein the plurality of sequential multi-bit entries comprises a second minimum bit log-likelihood ratio.

9. The decoder memory system of claim 6, wherein the plurality of sequential multi-bit entries comprises a parity check sign bit.

10. The decoder memory system of claim 6, wherein the plurality of sequential multi-bit entries comprises an index.

11. The decoder memory system of claim 6, wherein the plurality of sequential multi-bit entries comprises a parity checksum of hard decision bits.

12. The decoder memory system of claim 11, wherein the hard decision bits indicate a valid codeword is detected.

13. The decoder memory system of claim 11, wherein the hard decision bits indicate decoding complete for an iteration.

14. The decoder memory system of claim 1, wherein:
the parity check matrix H is stored in the first memory as a series of offset values; and
the offset values indicate at least one row index.

15. The decoder memory system of claim 14, wherein the at least one row index comprises a non-zero entry along a leftmost column of a circulant of the parity check matrix H.

16. The decoder memory system of claim 1, wherein submatrices along a diagonal of the parity check matrix H share a common offset value.

17. The decoder memory system of claim 1, wherein the first memory is configured to store only one row and one column of the parity check matrix H.

18. The decoder memory system of claim 1, wherein at least one of the second memory or the third memory are configured to store a plurality of words in a single row.

19. The decoder memory system of claim 18, wherein a last word of the plurality of words comprises empty memory cells when the last word is indivisible by 4.

20. A method of operating a decoder memory system, the method comprising:
receiving a first portion of a parity check matrix H from a first memory via a second memory, wherein the second memory is associated with a first decoding iteration of a tensor product code;
receiving a second portion from the first memory via a third memory, wherein the third memory is associated with a second decoding iteration of the tensor product code, wherein the second portion is same as the first portion, and wherein the second decoding iteration is performed subsequent to and based on the first decoding iteration; and
generating a low-density parity check decoded signal via a control module and based on (i) the parity check matrix H, (ii) the first decoding iteration, and (iii) likelihood ratios.

21. The method of claim 20, wherein:
the second memory comprises a plurality of rows;
each of the plurality of rows comprising a word;
the word comprises a plurality of sequential multi-bit entries;
the plurality of sequential multi-bit entries comprises a parity checksum of hard decision bits; and
the method further comprises indicating a valid codeword is detected via the hard decision bits.

22. The method of claim 20, wherein:
the second memory comprises a plurality of rows;
each of the plurality of rows comprising a word;
the word comprises a plurality of sequential multi-bit entries;
the plurality of sequential multi-bit entries comprises a parity checksum of hard decision bits; and
the method further comprises indicating decoding complete for an iteration via the hard decision bits.

23. The method of claim 20, further comprising storing the parity check matrix H as a series of offset values, wherein the offset values indicate at least one row index.

24. The method of claim 23, wherein the at least one row index comprises a non-zero entry along a leftmost column of a circulant of the parity check matrix H.

25. The method of claim 20, wherein submatrices along a diagonal of the parity check matrix H share a common offset value.

26. The method of claim 20, further comprising generating a decoded signal based on the decoder memory system.

27. A decoder memory system comprising:
first storing means for storing a parity check matrix H;
second storing means for receiving a first portion of the parity check matrix H from the first storing means, wherein the second storing means is associated with a first decoding iteration of a tensor product code;
third storing means for receiving a second portion of the parity check matrix H from the first storing means, wherein the third storing means is associated with a second decoding iteration of the tensor product code, wherein the second decoding iteration is performed subsequent to and based on the first decoding iteration, and wherein the second portion is same as the first portion;
fourth storing means for storing likelihood ratios; and
a control means for generating a low-density parity check decoded signal based on (i) the parity check matrix H, (ii) the first decoding iteration, and (iii) the likelihood ratios.

28. The decoder memory system of claim 27, wherein:
the second storing means stores a plurality of segregated portions; and
each of the plurality of segregated portions is associated with a group of rows in the parity check matrix H.

29. The decoder memory system of claim 27, wherein:
the third storing means stores a plurality of segregated portions; and
each of the plurality of segregated portions is associated with a group of rows in the parity check matrix H.

30. The decoder memory system of claim 27, wherein the fourth storing means stores a plurality of segregated portions.

31. The decoder memory system of claim 27, wherein:
the second storing means comprises a plurality of rows; and
each of the plurality of rows comprising a word.

32. The decoder memory system of claim 31, wherein the word comprises a plurality of sequential multi-bit entries.

33. The decoder memory system of claim 32, wherein the plurality of sequential multi-bit entries comprises a first minimum bit log-likelihood ratio.

34. The decoder memory system of claim 33, wherein the plurality of sequential multi-bit entries comprises a second minimum bit log-likelihood ratio.

35. The decoder memory system of claim 32, wherein the plurality of sequential multi-bit entries comprises a parity check sign bit.

36. The decoder memory system of claim 32, wherein the plurality of sequential multi-bit entries comprises an index.

37. The decoder memory system of claim 32, wherein the plurality of sequential multi-bit entries comprises a parity checksum of hard decision bits.

38. The decoder memory system of claim 37, wherein the hard decision bits indicate a valid codeword is detected.

39. The decoder memory system of claim 37, wherein the hard decision bits indicate decoding complete for an iteration.

40. The decoder memory system of claim 27, wherein:
the parity check matrix H is stored in the first storing means as a series of offset values; and
the offset values indicate at least one row index.

41. The decoder memory system of claim 40, wherein the at least one row index comprises a non-zero entry along a leftmost column of a circulant of the parity check matrix H.

42. The decoder memory system of claim 27, wherein submatrices along a diagonal of the parity check matrix H share a common offset value.

43. The decoder memory system of claim 27, wherein the first storing means comprises only one row and one column of the parity check matrix H.

44. The decoder memory system of claim 27, wherein the second storing means and the third storing means stores a plurality of words in a single row.

45. The decoder memory system of claim 44, wherein a last word of the plurality of words comprises empty memory cells when the word is indivisible by 4.

* * * * *